United States Patent [19]
Odanaka

[11] Patent Number: 5,160,996
[45] Date of Patent: Nov. 3, 1992

[54] STRUCTURE AND METHOD OF MANUFACTURE FOR SEMICONDUCTOR DEVICE

[75] Inventor: Shinji Odanaka, Osaka, Japan

[73] Assignee: Matsushita Electric Industrial Co., Inc., Japan

[21] Appl. No.: 744,651

[22] Filed: Aug. 9, 1991

Related U.S. Application Data

[63] Continuation of Ser. No. 368,385, filed as PCT/JP88/01017, Oct. 6, 1988, abandoned.

[30] Foreign Application Priority Data

Oct. 8, 1987 [JP] Japan .................. 62-254203
Apr. 11, 1988 [JP] Japan .................. 63-88714

[51] Int. Cl.$^5$ ............... H01L 27/02; H01L 29/06
[52] U.S. Cl. .................. 257/375; 257/374; 257/376
[58] Field of Search ............ 357/42, 47, 90, 91, 357/23.11

[56] References Cited

U.S. PATENT DOCUMENTS

| | | | |
|---|---|---|---|
| 3,925,120 | 12/1975 | Saida et al. | 357/42 |
| 4,729,006 | 3/1988 | Dally et al. | 357/42 |
| 4,729,964 | 3/1988 | Natsuaki et al. | 357/42 |
| 4,745,453 | 5/1988 | Mizutani | 357/42 |
| 4,760,433 | 7/1988 | Young et al. | 357/42 |
| 4,797,724 | 1/1989 | Boler et al. | 357/42 |
| 4,862,240 | 8/1989 | Watanabe et al. | 357/42 |
| 4,970,568 | 11/1990 | Hiraguchi et al. | 357/42 |

FOREIGN PATENT DOCUMENTS

| | | | |
|---|---|---|---|
| 55-153367 | 11/1980 | Japan | 357/42 |
| 57-091553 | 6/1982 | Japan | 357/42 |
| 57-132353 | 8/1982 | Japan | 357/42 |
| 58-218160 | 12/1983 | Japan | 357/42 |
| 60-074468 | 4/1985 | Japan | 357/42 |
| 60-117654 | 6/1985 | Japan | 357/42 |
| 61-129861 | 6/1986 | Japan . | |
| 61-242064 | 10/1986 | Japan . | |
| 63-244876 | 10/1988 | Japan | 357/42 |

OTHER PUBLICATIONS

"A New Process for One Micron and Finer CMOS" by Russel A. Martin et al.; 1985 IEEE: IEDM85 pp. 403-406.

"A Self-Aligned 1-$\mu$m-Channel CMOS Technology with Retrograde n-Well and Thin Epitaxy" by Yuan Taur et al; 1985 IEEE; IEEE Transactions on Electron Devices, vol. ED-32, No. 2, Feb. 1985; pp. 203-209.

"A New Method for Preventing CMOS Latch-Up" by K. W. Terrill et al; 1984 IEDM; pp. 406-409.

Primary Examiner—Mark V. Prenty
Attorney, Agent, or Firm—Lowe, Price, LeBlanc & Becker

[57] ABSTRACT

A semiconductor device comprises a semiconductor substrate of a first conductivity type, a well which is a second conductivity type, a buried layer, which is of the first conductivity type, and an insulating isolation layer formed extending to an upper surface of a side region of the well. The buried layer has a first portion of a higher dopant concentration than the semiconductor substrate and formed in a deep region of the semiconductor substrate directly below the well, and a second portion formed in a region of the substrate which is positioned higher than the region in which the first portion is formed. The first and second portions of the buried layer are formed integrally in a region of the semiconductor substrate which is directly below the insulating isolation layer, surround the well within the semiconductor substrate, and have a high concentration of a dopant that is of the first conductivity type at a position which is directly below the insulating isolation layer. A transistor of the first conductivity type is formed at the well and a transistor of the second conductivity type is formed in the semiconductor substrate above the second portion of the buried layer.

5 Claims, 24 Drawing Sheets

STRUCTURE AND METHOD OF MANUFACTURE FOR SEMICONDUCTOR DEVICE

This application is a continuation application of application Ser. No. 07/368,385, filed as PCT/JP88/01017, Oct. 6, 1988 and now abandoned.

FIELD OF TECHNOLOGY

The present invention relates to simplification of a manufacturing process for complementary semiconductor devices, which are becoming increasingly miniaturized and increasingly complex, and to a high component-density semiconductor device having enhanced resistance to CMOS latch-up.

BACKGROUND TECHNOLOGY

The importance of CMOS technology in the VLSI field has grown, as a result of requirements for a high noise margin and low power consumption However as miniaturization has increased, serious problems have arisen with regard to preventing stray thyristor operation which causes the CMOS latch-up phenomenon to occur between mutually adjacent portions of an n-channel MOSFET and p-channel MOSFET, and with regard to maintaining a sufficient level of withstanding voltage between mutually adjacent elements.

Various forms of device configuration and manufacturing process have been proposed for overcoming these problems. These proposals include the use of a configuration containing wells, formation of a buried high concentration layer, and formation of a self-aligned channel stop at the edge of a well region.

Summaries of these various structures and methods will be given successively in the following, together with respective problems that have arisen with these.

Firstly, a method which uses an epitaxial structure over a high dopant concentration substrate will be described, referring to FIG. 17. This structure has been proposed by Yuan Taur et al, in the I.E.E.E. Transactions on Electron. Devices, Vol. ED-32, No. 2, February 1985 pp. 203–209.

In FIG. 17 numeral 51 denotes an n-type well, 52 is a high dopant concentration substrate (p+), 53 denotes a low dopant concentration epitaxial layer (p), 56 denotes an insulating isolation layer, 60 denotes a channel stop (p+). The region PA in the left half of the diagram is a p-channel transistor region, and region NPA in the right half of the diagram is an n-channel transistor region.

With this structure, a thin epitaxial layer 53 having a thickness of 4.5 μm is formed upon the high concentration (at least $10^{19}$ cm$^{-3}$) substrate 52, and then a 2.5 μm layer of photoresist is selectively formed. Using the photoresist layer as a mask, high-energy implantation of phosphorus at 700 KeV is performed, and then short-term annealing for 4 hours at 1050° C. is executed. As a result, a retrograde n-well 51 is formed, having a peak value of concentration in a deep portion of the well. Due to the formation of this n-type well 51 by high-energy implantation, and low-temperature short-term annealing, diffusion of boron (i.e. the substrate dopant) from the high concentration substrate 52 is prevented, and it becomes possible to form the n-type well 51 in the thin epitaxial layer 53, to thereby enhance the CMOS latch-up prevention capability.

Normally with such a semiconductor device structure, the high concentration substrate (p+) 52 is connected to ground potential (Vss) while the n-type well 51 is set to the power supply potential (V$_{DD}$) due to the n+ layer 54 (provided for fixing the potential of the well) that is disposed closely adjacent to the source region 55s of the p-channel transistor.

A stray vertical pnp transistor arises with this structure, where p, n and p thereof are respectively the drain region 55d of the p-channel transistor, the n-type well 51, and the low dopant concentration epitaxial layer (p) 53 together with the high concentration substrate (p+) 52. If for example a latch-up trigger current flows (as holes h injected from the drain region 55d) to pass through the virtual base region (i..e the n-type well 51) and enters the low dopant concentration epitaxial layer 53, then this current will be immediately absorbed by the high concentration substrate (p+) 52 which is securely held at a fixed potential at its rear face. This serves to prevent any localized increase in potential of the low dopant concentration epitaxial layer 53. A stray lateral npn transistor also arises, having the low dopant concentration epitaxial layer 53 as its virtual base. The n, p and n of this stray lateral nph transistor are respectively the drain region 54d of the n-channel transistor, the low dopant concentration substrate (p) 53, and the n-well 51. However due to the device structure, this stray transistor cannot be set in the ON state. Thus with this configuration, a sufficient degree of suppression of the stray vertical pnp transistor operation is achieved, to thereby suppress latch-up.

However as described hereinafter, a stray lateral pnp transistor is formed below the insulating isolation layer 56, (where the p, n and p of this transistor are respectively the drain region 55d of the p-channel transistor, the well 51, and the low dopant concentration epitaxial layer (p) 53), and this in conjunction with the stray lateral npn transistor (where n is the drain region 54d of the n-channel transistor, p is the low dopant concentration substrate (p) 53, and n is the n-type well 51) forms a stray PNPN thyristor. As the structure is increasingly miniaturized, the width of the insulating isolation layer 56 becomes so small that satisfactory performance cannot be achieved, due to the presence of this stray PNPN thyristor.

For that reason, to suppress CMOS latch-up with this technology, it is necessary to limit the minimum spacing between the n-channel transistor and p-channel transistor to approximately 4 μm. If the spacing is further reduced, then the epitaxial layer 53 must be made even more thin. However it is necessary to suppress the diffusion of boron (i.e. the substrate dopant) from the high concentration substrate 52 to an absolute minimum. This is very difficult to achieve. The problem of reducing the spacing width of the insulating isolation layer 56 is closely related to the method of forming the n-type well 51, and the configuration and method of forming the channel stop 60 which is disposed immediately below the insulating isolation layer. The basic features of forming the n-well 51 and the channel stop 60 will be described referring to FIG. 18.

Firstly, an oxide film 82 and a nitride film 81 are formed on the surface of the low dopant concentration epitaxial layer 53, which has been grown upon a high concentration substrate (p+) 52. A photoresist pattern 83 is then selectively formed on the result, and ion implantation of the n-type well 51 is executed through this pattern. An insulating film 84 is then formed over the entire surface (FIG. 18(a)).

Next, lift-off processing is executed such that the insulating film 84 is left only upon the region of the n-well 51. Further patterning processing is then executed to form a photoresist pattern that corresponds to the insulating isolation layer 56. The channel stop 60 is then formed by implantation (FIG. 17(b)). It is important to note that the channel stop 60 is formed by means of the insulating film 84 such as to substantially coincide in position with the edge of the n-type well 51. That is to say, with this process, the channel stop 60 is formed at the edge of that n-type well in a substantially self-aligned manner.

Using the photoresist pattern 85, etching of the insulating film 84 and the nitride film 81 is executed, and a nitride film pattern is formed corresponding to the insulating isolation layer 56 (FIG. 18(c)). Next, the insulating isolation layer 56 is formed by the usual LOCOS thermal oxidation process (FIG. 17(d)).

A very important question with regard to this process is that at the point in time at which ion implantation is executed of the channel stop 60 (which generally has a higher concentration than the n-type well 51), the region of the n-type well 51 has been compensated by migration in the lateral direction. In addition, as a result of the thermal oxidation processing of the portion 161 (shown in FIG. 18) of the channel stop 60, large-scale diffusion occurs within the n-type well 51, due to the effect of oxidation-enhanced diffusion. Due to this diffusion, part of the n-type well dopant ions are compensated in a localized region, whereby reduction of the width of the virtual base region (n-well 51) of the stray lateral pnp transistor occurs ((where the P, N and P of this transistor are respectively the drain region 55d of the p-channel transistor, the n-well 51, and the low dopant concentration epitaxial layer (p) 53). The $h_{FE}$ of this stray pnp transistor is thereby increased, and that transistor therefore responds very sensitively to injection of a trigger current from the drain region 55d of the p-channel transistor. This is a serious defect, which results from reduction of the size of the insulating isolation layer 56, i.e. which is caused by an increased degree of miniaturization.

Another proposal has been made by K. W. Terril et al, (I.E.E.E. 1984 I.E.D.M) Technical Digest pp. 406–409, which is shown in FIG. 19. In FIG. 19, numeral 61 denotes an n-well, 62 is a high concentration buried layer (p+), and 63 denotes a low dopant concentration substrate (p).

With this structure, after the n-well 61 has been formed, the high concentration buried layer (p+) 62 is formed uniformly at a location which is deeper than the n-well 61. In the same way as for the epitaxial structure described above, a stray pnp transistor arises (where p is the drain region 65d of the p-channel transistor, n is the n-well 61, and p is the low dopant concentration substrate (p) 63 and the high concentration buried layer (p+) 62). If a latch-up trigger current flows from the drain region 65d for example, due to the injection of holes h, the structure has the objective of suppressing any localized increase in potential which might result from this current passing through the virtual base region (i.e. the n-well 61) into the low dopant concentration substrate 63.

However this structure differs from the epitaxial structure example in that the potential of the high concentration buried layer (p+) 62 is floating, and hence such a trigger current cannot be absorbed with sufficient effectiveness, as is achieved with the epitaxial structure.

In addition, both with the structure using the epitaxial layer and the structure in which a high concentration region is formed by implantation, similar problems occur. That is to say, of the holes that pass into the low dopant concentration substrate through the n-well (having been injected from the source or the drain region of the p-channel transistor), most will be absorbed by the high concentration region. However those holes which flow in the lateral direction will not be absorbed sufficiently, and this will result in the potential of a specific region of the low dopant concentration substrate being increased. Hence, a trigger current will flow through that portion, which will turn on the stray PNPN thyristor, and hence will result in the latch-up phenomenon occurring. This is a very serious problem, that results from a reduction in the spacing between the borders of the n+ and p+ layers of the regions that constitute the complementary transistor pair, and presents an obstacle to increased levels of integration of CMOS complementary semiconductor devices.

In addition, in the case of the epitaxial structure, the cost of an epitaxial wafer is high, and it is difficult to attain increased productivity by achieving stable manufacture of large-diameter wafers having a thin epitaxial layer. Furthermore it is necessary to make the thickness of the epitaxial region (i.e. the low dopant concentration region) as small as possible, in order to assure effective absorption of holes. However a problem arises that a very shallow low dopant concentration region cannot be achieved, due to out-diffusion (i.e. diffusion of substrate dopant ions) from the high concentration region during growth of the epitaxial layer. On the other hand with the method in which a high concentration region is formed by implantation, although the manufacturing cost is not excessive, it is not possible to achieve a sufficient degree of effectiveness of suppression of the CMOS latch-up phenomenon, since it is not possible to fixedly determine the potential of the high concentration buried layer (p+) at its rear face or by a diffusion layer formed on the upper face of the semiconductor substrate. In order to increase the dopant concentration of the high concentration buried layer (p+), to achieve sufficient absorption of the trigger current, it is necessary to use high-energy high-dose implantation ($1.0 \times 10^{14}$ cm$^{-2}$ or higher). However the problem then arises that point defects are produced within the substrate.

Thus, with both the epitaxial structure and the structure having a high concentration buried layer formed by high-energy high-dose implantation, satisfactory characteristics cannot be achieved.

Another example of the use of a well and of a channel stop below the insulating isolation layer in a miniaturized device will be described referring to the manufacturing process cross-sectional views of FIG. 20. This has been proposed by R. A. Martin, (I.E.E.E. 1984 I.E.D.M) Technical Digest pp. 403–406.

With this manufacturing process, a channel stop is formed directly below an insulating isolation layer, between mutually adjacent portions of the n-channel and p-channel transistors. The objective of the proposal is to achieve simplification of the manufacturing process and a more miniaturized structure.

In FIG. 20(a), firstly a p-type dopant is implanted to a high concentration, to form an n-channel stop 75, in a portion of a region which will constitute an insulating isolation layer. Next, an insulating isolation layer 76 is formed by the usual LOCOS thermal oxidation processing, and then a pattern of photoresist 80 is formed over a part of the insulating isolation layer 76. At this time, the n-type channel stop has been diffused into the interior of the substrate as a result of the aforementioned thermal oxidation (FIG. 20(b)).

Next, in FIG. 20(c), high-energy n-type implantation is then executed through the photoresist pattern 80, to produce a comparatively high concentration n+ region as an n-well 71, together with a high concentration n+ region that is disposed immediately below a portion of the insulating isolation layer 76 and constitutes a part of the n-well 71. Thus, a p-type channel stop is formed in a single step.

Using the normal manufacturing process, a gate oxide film 78, gate electrode 77, and source and drain regions 73s, 73d and 74s, 74d and aluminum connecting lead 79n are then formed, to obtain a complementary semiconductor device as shown in FIG. 20(d).

Thus with this manufacturing process, the p-type channel stop is formed by a compensation method through implantation of n+ ions, executed in a condition in which p+ diffusion to form an n-type channel stop has already occurred. In this way, oxide-enhanced diffusion of the type shown in FIG. 18 will not cause diffusion into the n-well from the channel stop 75. However it is extremely difficult to set the dopant concentration for the channel stop at the n-type well 75 side, to achieve correct compensation. That is to say, the concentration is established by implantation processing, and the p+ channel stop 75 is also affected by oxide-enhanced diffusion resulting from the LOCOS processing. It is necessary to control the n+ implantation precisely, and in addition to accurately control the concentration distribution in the depth direction, such as to obtain both of the requisite concentrations for the p+ channel stop 75. If there is even a small amount of inaccuracy, then the shape of the boundary portion 176 shown in the drawings will not be accurately determined, so that the threshold voltage Vt at the n-well 71 side of the insulating isolation layer 76 will be lowered, and hence the channel stop function will not be achieved. Furthermore, this method of manufacture raises particular problems with regard to the n-type channel stop 75, which is not compensated. That is to say, due to the work function of the connecting leads (formed of n+ polysilicon or Al) which are formed on the insulating isolation layer 76, the threshold voltage of the stray n-channel MOSFET can easily become lower than the threshold voltage of the stray p-channel MOSFET. In order to increase the threshold voltage of the stray n-channel MOSFET it is necessary that the n-type channel stop 75 have a high dopant concentration. However due to the fact that the p-type channel stop is formed by compensation, the concentration of the n-type channel stop 75 will only be a fraction of that of the p-type channel stop. Thus it is difficult to set the level of concentration of the n-type channel stop 75 to a sufficiently high value. For these reasons, the width of the insulating isolation layer cannot, be reduced by very much.

Furthermore, due to the fact that the n+ implantation forms the n-well 71 at the same time as the channel stop is formed, in order to simplify the processing, a CMOS structure providing optimum suppression of latch-up cannot be achieved, since the optimum implantation conditions for forming the channel stop and the optimum implantation conditions for forming the n-well 71 do not coincide. Thus this method is not suitable for obtaining increased miniaturization.

As described above, the prior art proposals can be broadly divided into two types, i.e. a structure and method of manufacture in which a high concentration layer is used for suppression of the stray vertical transistor effect, and a structure and method of manufacture in which a channel stop is provided below the insulating isolation layer, for suppressing the stray lateral transistor effect.

SUMMARY OF THE INVENTION

It is an objective of the present invention to provide a completely new manufacturing process and structure for a complementary semiconductor device, whereby the problems presented by the prior art structures are eliminated. That is, the prior art problems of inability to provide a satisfactory degree of structure miniaturization, and also with respect to obtaining a sufficient degree of resistance to the CMOS latch-up phenomenon are overcome by the invention.

To achieve the above objectives, a semiconductor device according to the present invention comprises, consecutively formed:

a substrate of a first conduction type;

a well which is of a second conduction type and is selectively formed in the substrate;

a buried layer which is of the first conduction type, having a higher dopant concentration than that of the substrate, and formed in a deeply situated region which is positioned directly below the well that is of the second conduction type; and a well which is of the first conduction type, which is formed in a region at a shallower depth than the buried layer and which is in a plane that surrounds the well that is of the second conduction type;

and characterized in that the well that is of the first conduction type and the buried layer are formed as a continuous layer within the semiconductor substrate, with a portion of that layer being disposed directly below an insulating isolation layer that is positioned close to a surface edge of the well that is of the second conduction type, and formed with a dopant to provide the first conduction type and having a dopant concentration that is higher than the substrate dopant concentration, and moreover characterized in that a transistor of the first conduction type is formed at the well of the second conduction type, and a transistor of the second conduction type is formed at the well of the first conduction type.

With such a semiconductor device structure, since a buried layer having a high concentration is formed in a deep region of the substrate, directly below the well that is of the second conduction type, and is formed within the semiconductor substrate as a continuously extending layer with a high concentration buried layer that is formed in a shallow region surrounding the well, the potential of the high concentration buried layer can be easily set from the upper part of the semiconductor substrate.

Furthermore, any injection of current in the depth direction or the lateral direction from the well that is of the second conduction type into the low dopant concentration substrate is completely absorbed by the high concentration buried layer, whereby the trigger current of the stray thyristor can be effectively suppressed. Moreover, due to the fact that the well that is of the first conduction type and that of the second conduction type, each having a high concentration, are formed directly below the insulating isolation layer, the manufacturing process to produce a channel stop can be eliminated, and insulated isolation is effectively achieved. This enables the spacing between the two transistors of the first and second conduction type resistance to be easily reduced.

DESCRIPTION OF PREFERRED EMBODIMENTS

First Embodiment

Figure 1:
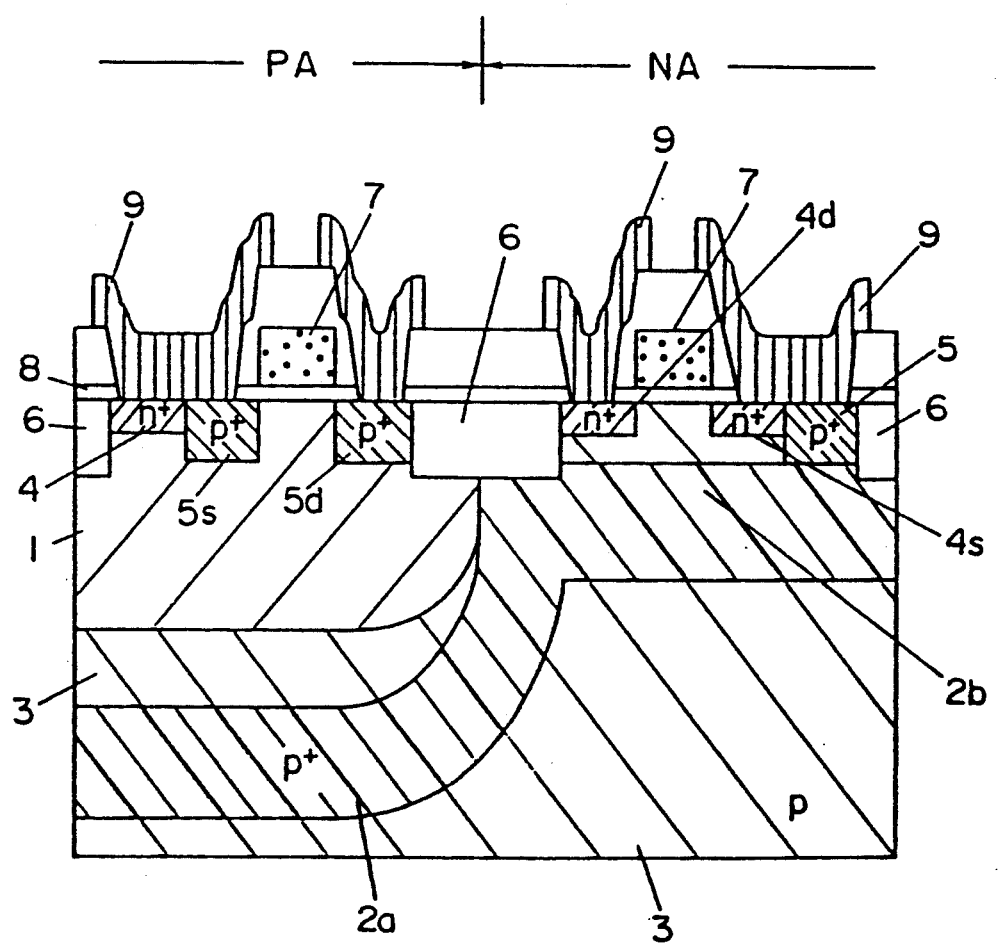
FIG. 1 is a cross-sectional view in elevation of the structure of a first embodiment of a semiconductor device according to the present invention.

In FIG. 1, numeral 1 denotes an n-well, 2a denotes a high concentration buried layer (p+), 3 denotes a low dopant concentration substrate (p), 4, 4s and 4d respectively denote n+ layers, 5, 5s and 5d respectively denote p+ layers, 6 denotes an insulating isolation layer, 7 denotes a gate electrode, 8 denotes a gate oxide film, 9 denotes an aluminum connecting lead. The specific features of the structure of FIG. 1 are that the n-well 1 that is provided to form a p-channel transistor, is surrounded completely by the high concentration buried layer (p+) 2a and the p-well 2b, and that the high concentration buried layer (p+) 2a is connected to ground potential through the p+ layer 5 that is provided for fixing the potential of the p-well 2b.

As a result, the high concentration buried layer (p ) 2a effectively absorbs holes that are injected in the depth direction and in the lateral direction towards the low dopant concentration (p+) substrate 3 from the drain region 5d of the p-channel transistor through the n-well 1. Suppression is thereby achieved of any rise in potential of some region within the low dopant concentration (p+) substrate 3 which might result in a flow of trigger current, thereby preventing the stray pnpn thyristor from being triggered to the ON state.

Specifically, for the stray vertical pnp transistor, p represents the drain region 5d of the p-channel transistor, n is the n-well 1, and p is the low dopant concentration (p+) substrate 3 together with the high concentration buried layer (p+) 2a. Holes which are injected from the drain region 5d, causing a latch-up trigger current to flow, will enter the low dopant concentration (p+) substrate 3 through the virtual base region (n-well 1). However these holes are immediately absorbed by the high concentration buried layer (p+) 2a, which is held at a fixed potential through a path from the surface layers. In this way, any localized increase in potential of the low dopant concentration substrate 3 will be prevented. A stray lateral npn transistor is also formed, where n is the drain region 4d of the n-channel transistor, p is the p-well 2b, and n is the n-well 1. The low dopant concentration substrate 3 constitutes a virtual base of this stray lateral npn transistor, and setting of this stray transistor to the ON state is prevented. The high concentration buried layer (p+) 2a is also effective in absorbing any trigger current of a stray lateral pnp transistor, and so functions to prevent operation of the corresponding stray thyristor.

Thus, this structure ensures effective absorption of the trigger current of the stray lateral transistor that is produced as a result of miniaturization of the insulating isolation layer 6, i.e. as a result of reduction of the device dimensions. The latch-up phenomenon is thereby effectively suppressed.

Figure 2A:
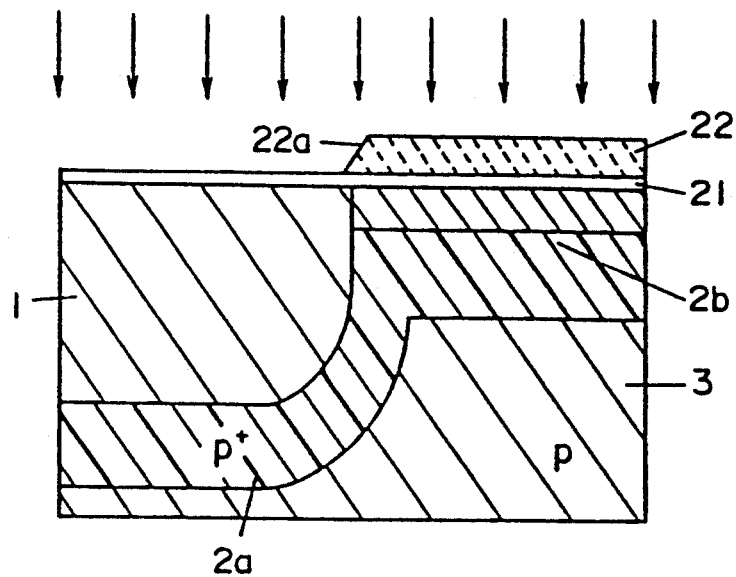
FIGS. 2a–2d show partial cross-sectional views illustrating the manufacturing process of the first embodiment.
Figure 2B:
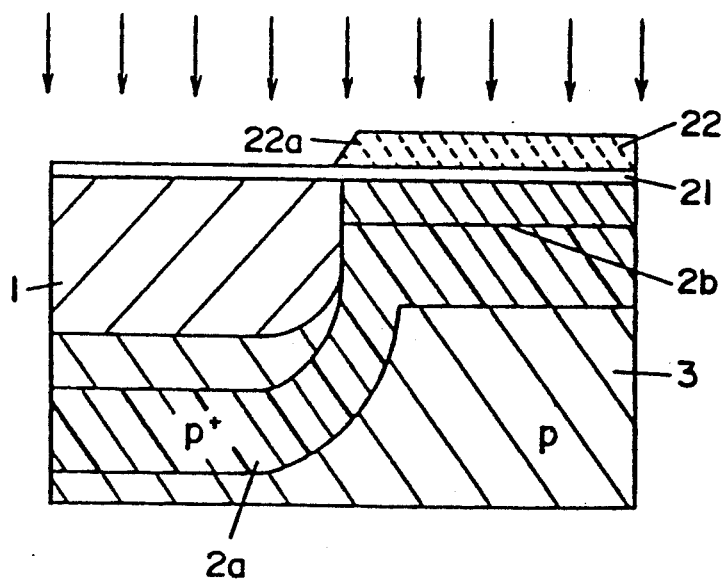

Specific points relating to an example of a method of manufacture for this embodiment will be described referring to FIGS. 2(a) to 2(d). Firstly, as shown in FIG. 2(a), an insulating film 21 is formed as a passivation layer over the low dopant concentration (p+) substrate 3, by the usual process. A patterned layer of photoresist 22 is then formed on the film 21. To obtain the photoresist pattern, a coating of photoresist is first formed to a thickness which is such as to prevent subsequent implantation of the phosphorus that is used in forming the n-well (when an acceleration voltage of 700 KeV, and dose of $1.0 \times 10^{13}/cm^2$ is used for this implantation). The photoresist layer can have a thickness of approximately 2 m (providing an obstruction factor of approximately 0.82), and has some degree of edge taper. Boron is then implanted into the overall wafer surface (with acceleration voltage of 1.5 MeV, and dose of $3.0 \times 10^{13}/cm^2$). At this time, the p-well 2b is formed as a retrograde p-well, with a shallow well depth, and having a high concentration buried layer (p+). The p-well 2b is formed in a region which is covered by the photoresist 22 (i.e. the n-channel transistor region). At the same time, the high concentration buried layer (p+) 2a is formed at a greater depth, in a region that is not covered by the photoresist layer 22 (i.e. the p-channel transistor region). Next, as shown in FIG. 2(b), without removing the photoresist pattern, implantation of phosphorus ions (with acceleration voltage of 700 KeV, and dose of $1.0 \times 10^{13}/cm^2$) is executed, to form the retrograde n-well 1.

Figure 3A:
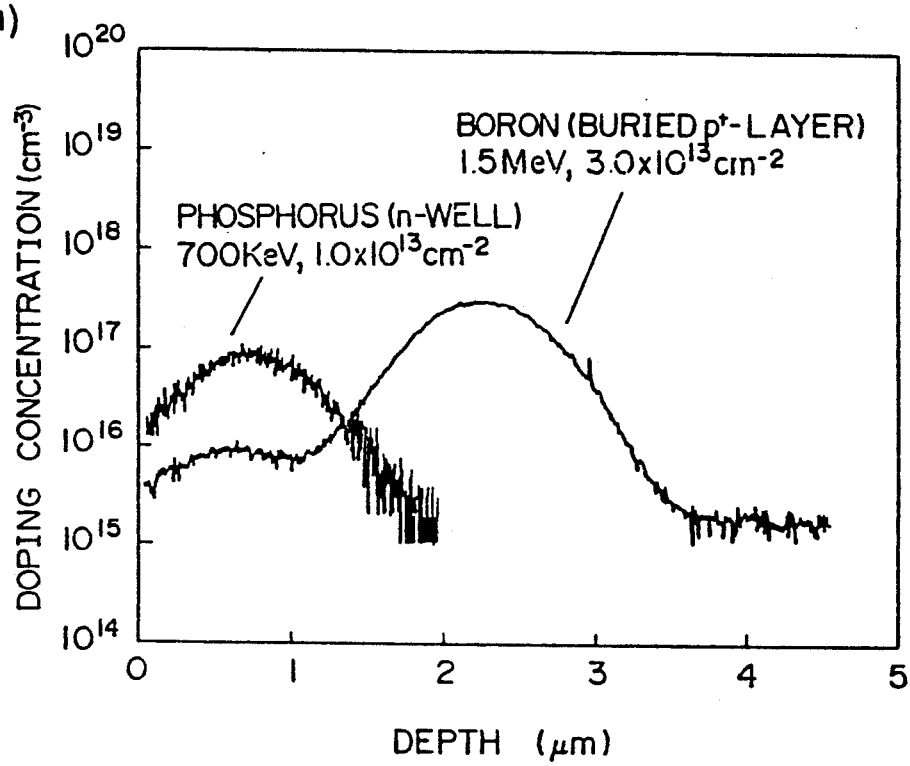
FIGS. 3a–3b show test results obtained from a sample semiconductor device according to the present invention by using a SIMS apparatus, showing the distribution of implanted dopant concentration in the substrate depth direction.

As shown in FIGS. 3(a) and (b), SIMS data obtained from an actual device confirm that two retrograde wells and a high concentration buried layer (p+) are formed by the photoresist coating and high-energy implantation process described above.

FIG. 3(a) shows the result of measurement of dopant distribution in the depth direction from the substrate surface, for the portion which was not covered by the photoresist. This indicates that a retrograde n-well is formed having a peak dopant concentration at a depth that is close to 1 μm, as well as a high concentration buried layer which is formed at a greater depth than that retrograde n-well and has a peak dopant concentration at a depth of approximately 2.5 μm.

Figure 3B:
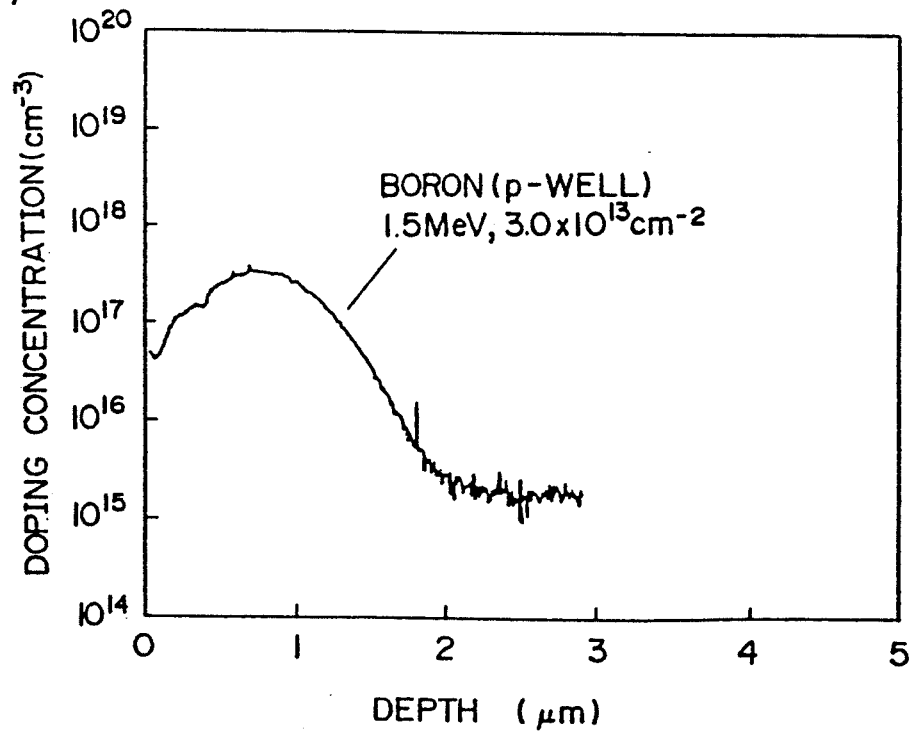

In addition, FIG. 3(b) shows the result of measuring the dopant concentration of the part of the substrate surface that was covered by the photoresist layer. This indicates that in this case, only a retrograde p-well is formed, which has a peak dopant concentration at a depth of approximately 1 μm. It can thus be understood that implantation of phosphorus ions is completely prevented by the photoresist, while in addition, the application of the photoresist layer results in the peak concentration produced by the boron implantation occurring at a depth which is shifted by approximately 1.5 μm.

Figure 4:
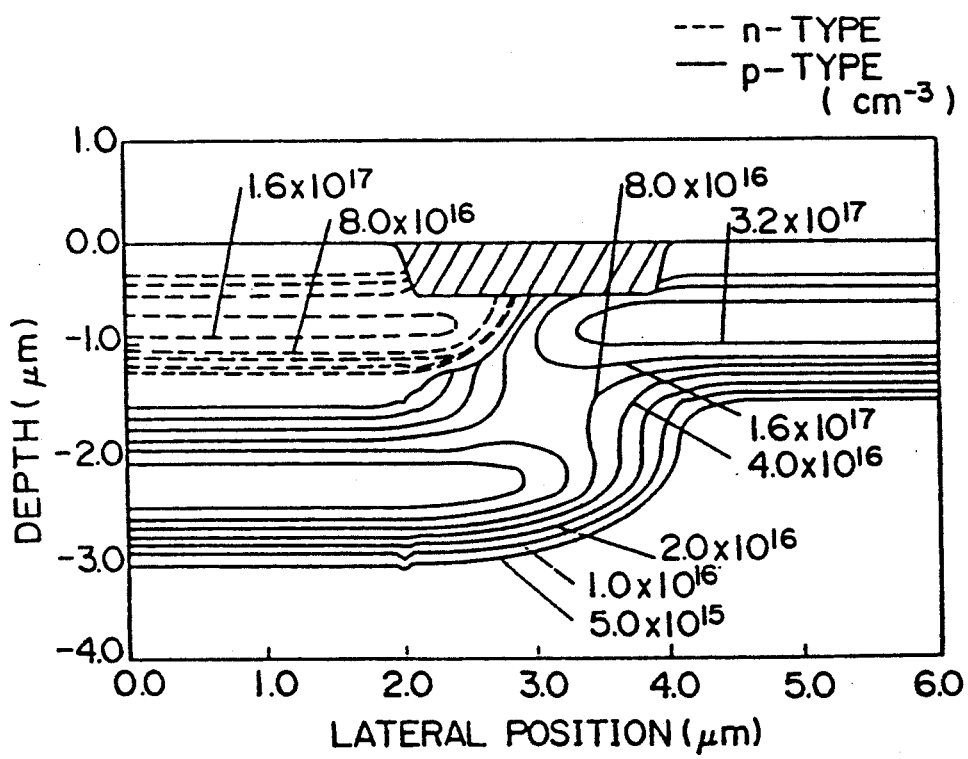
FIG. 4 is a dopant concentration contour line diagram, showing 2-dimensional distributions of dopant, obtained by computer simulation of an implantation condition of a manufacturing process for a semiconductor device according to the present invention.

FIG. 4 shows the results of computer simulation of 2-dimensional dopant distribution resulting from implantation of phosphorus and boron ions as described above. The simulation conditions are: photoresist film thickness = 1.9 μm, taper angle of the photoresist film = 85°, implantation angle 7° for phosphorus (acceleration voltage of 700 KeV, and dose of $1.0 \times 10^{13}/cm^2$), and for boron (acceleration voltage of 1.5 MeV, and dose of $3.0 \times 10^{13}/cm^2$), annealing for 2 hours at 1050° C. in an $N_2$ atmosphere. These simulation results agree with the SIMS measurement results, showing that a high concentration (i.e. $3.2 \times 10^{17}$ /cm²) p-well is formed directly below the tapered portion, and that a high concentration buried layer (p+) is formed immediately below the n-well, with the buried layers constituting a continuous layer.

That is to say, as shown in FIG. 2, a step-shaped high concentration buried layer (p+) is formed within the substrate below the tapered edge portion 22a of the photoresist layer 22. In this way, the high concentration buried layer (p+) 2a is formed in a deep region of the substrate, while a high concentration buried layer (p+) is also formed, at a more shallow depth, as the p-well. These deep and shallow high concentration buried layers are formed as a continuous layer. Thus, since the p-well is fixed at ground potential, the potential of the high concentration buried layer (p+) 2a is held at ground potential, by being connected thereto through a low resistance.

As a result, any latch-up trigger current that is injected in the depth direction or the lateral direction through the n-well 1 into the low dopant concentration substrate (p) 3 will be effectively absorbed by the high concentration buried layer (p+), and hence highly effective suppression of latch-up is achieved. In addition, since both phosphorus and boron ions are implanted using the photoresist pattern 22, the p-well 2b and the n-well 1 are both formed in a self-aligned manner. It would also be possible to also use the photoresist pattern that is utilized for implantation to form the wells, as a threshold voltage control mask for the p-channel transistor, thereby achieving a further simplification of mask processing.

Figure 2C:
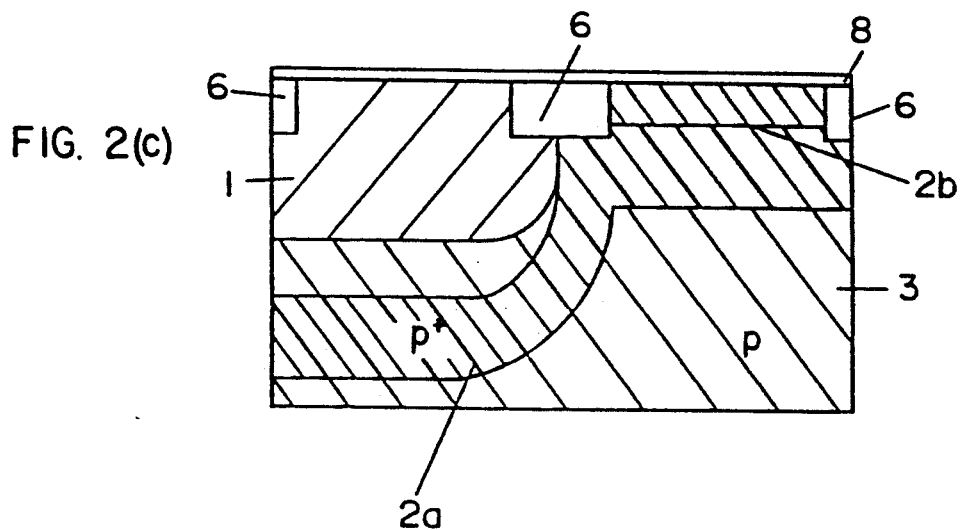
Figure 2D:
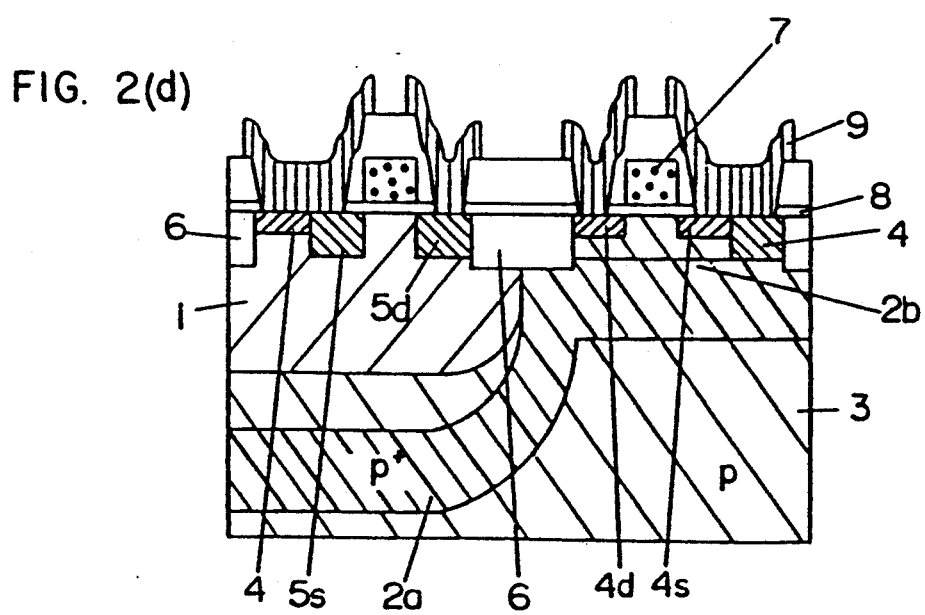

FIGS. 2(c) and (d) are cross-sectional views which broadly illustrate the process of forming the insulating isolation layer 6 and then formation of the transistors. Generally speaking, the insulating isolation layer 6 is formed by thermal oxidation, using the LOCOS method. However in this example an etching technique is used, whereby slots are formed in the substrate and the insulating material is then embedded in these to provide the insulating isolation layer 6. It would of course be equally possible to form the insulating isolation layer 6 in the opposite manner. Thereafter, the gate oxide film 7, gate electrode 7, n+ region 4, p+ region 5, and aluminum connecting leads 9 are formed by the usual process, to thereby obtain the complementary semiconductor device.

If the implantation profile is suitably controlled during implantation of the boron and phosphorus in steps 2(a), 2(b), such that a suitable level of channel stop dopant concentration is produced directly below the insulating isolation layer 6, then it becomes possible to eliminate the step of implantation of the channel stops, and it is not necessary to add a mask for producing the channel stops. In addition, both the p-channel and n-channel transistor channel stop regions are formed in a self-aligned manner, while wells are formed at the same time As a result, a minimum of overlapping of the high concentration layers of the n-well and p-well directly below the insulating isolation layer will occur, so that lateral migration is suppressed, and the spacing between the stray n-channel transistor and stray p-channel transistor can be reduced. This is very effective in enabling miniaturization of the CMOS structure In actuality, as illustrated by the example of FIG. 4, a p-channel stop region having a high concentration of $8 \times 10^{16}/cm^2$ to $1.6 \times 10^{16}/cm^2$ is formed at the n-well side, directly below the insulating isolation layer, while a an n-channel stop region having a high concentration of $6 \times 10^{17}/cm^2$ to $3.2 \times 10^{17}/cm^2$ is formed at the p-well side at the same time.

Thus with the present invention as described above, channel stop regions for both of the transistors of the complementary semiconductor device are formed at the same time as an n-well and a p-well, in a self-aligned manner, and as a result of fixing of potential by connection from the substrate surface through the low-resistance high concentration buried layer (p+), any latch-up trigger current is effectively absorbed. In this way, a high component density complementary semiconductor device can be configured, which is strongly resistant to latch-up.

Figure 5A:
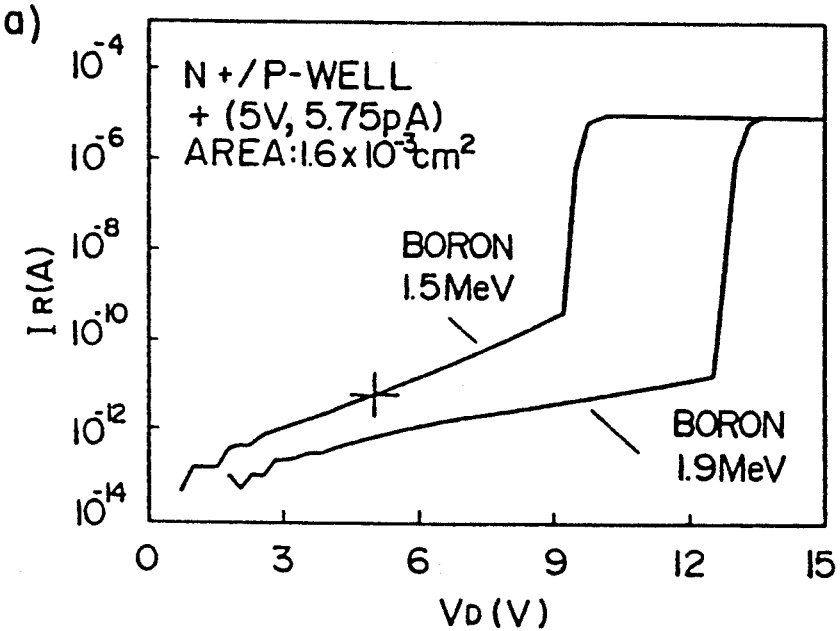
FIGS. 5a–5b show reverse bias characteristics of diodes formed at the wells of a test sample of a semiconductor device according to the present invention.
Figure 5B:
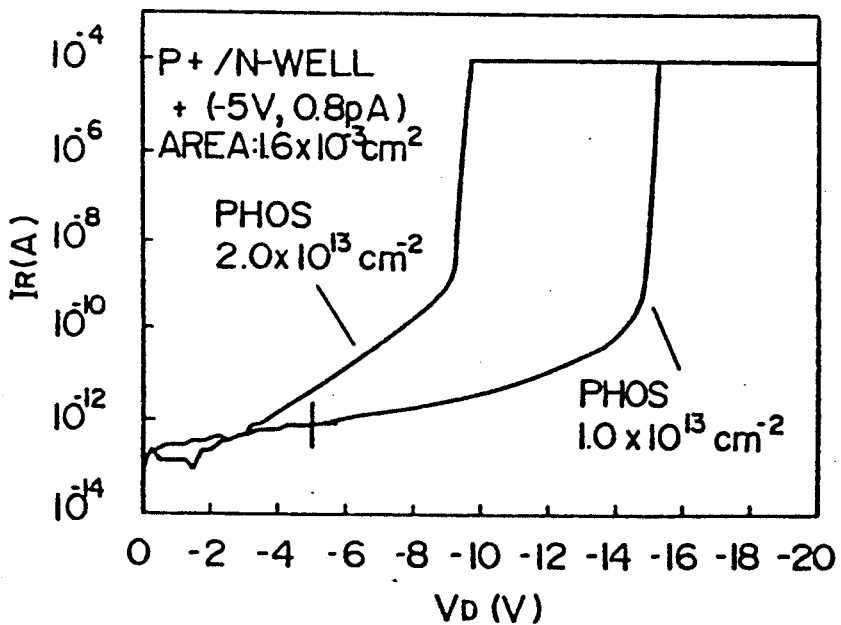
Figure 6A:
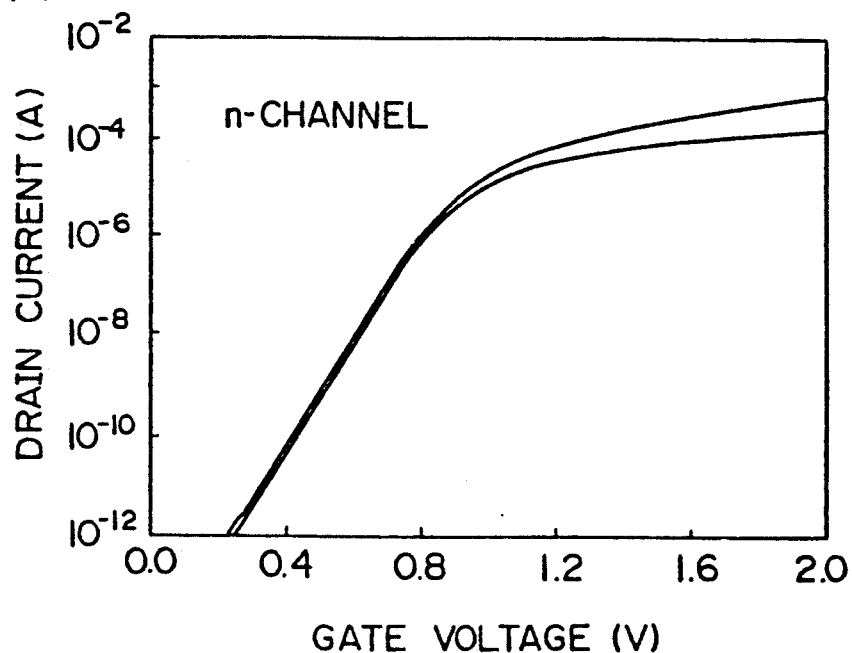
FIGS. 6a–6b show the electrical characteristics of transistors formed at the wells of the test sample.
Figure 6B:
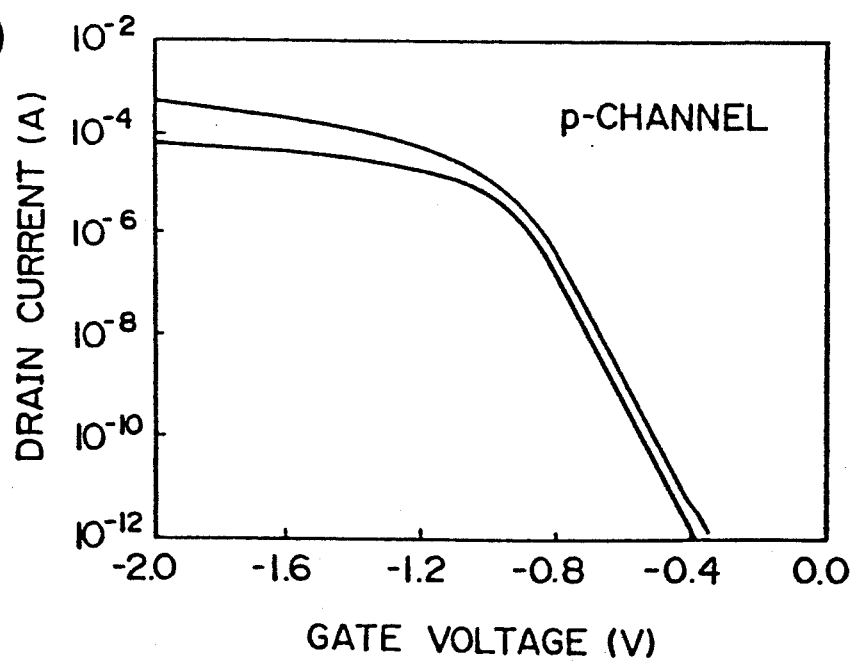

The characteristics of an actual semiconductor device, obtained from computer simulation of formation of the channel stops and the wells will be described in the following. Insufficient research has been carried out so far on this type of device, which is manufactured by high-energy, high concentration implantation. For this reason, an evaluation was made of the characteristics of diodes formed at both of the wells, and of the characteristics of the p-channel and n-channel transistors that are formed at the wells. These results will be described referring to FIGS. 5 and 6. FIGS. 5(a) and (b) respectively show the reverse bias characteristics of large-area $(1.6 \times 10^{-3}/cm^2)$ diodes which are formed at the wells, i.e. formed as n+ - p-well and p+ - n-well diodes respectively. As can be seen, the breakdown voltage (at which the reverse bias current abruptly increases) depends on the implantation energy and upon the dose. This is due to the fact that the concentration values of the wells will vary in accordance with these respective conditions. With a reverse bias of +5 V, a leakage current of approximately 8 to 5.75 pA will flow. It is particularly notable that no abnormal level of leakage current was measured (for values of reverse bias extending up to the breakdown voltage) as having resulted from point defects produced by the high energy implantation.

Figure 8A:
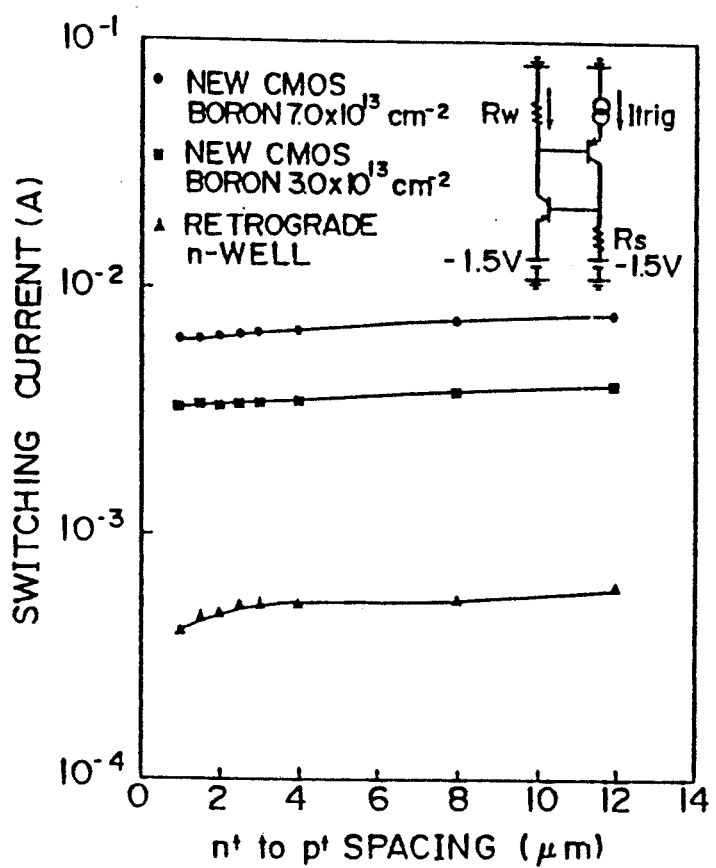
FIGS. 8a–8b show the latch-up characteristics of the test sample.

FIG. 8 shows the transistor sub-threshold characteristics, i.e. the values of drain current that flow as the gate voltage is varied, with the drain voltage fixed at +3.3 V or −3.3 V. It was found that no dependence upon the implantation conditions occurred.

The characteristics shown in FIG. 7 were evaluated for channel stop which is disposed directly below the insulating isolation layer, by the following method: (1) Respective p+ layers were formed at both sides of the insulating isolation layer, extending over the respective wells, and a polysilicon gate layer was formed over the insulating isolation layer. The action of the p-channel stop region (n+) formed within the n-well, directly below the insulating isolation layer was then evaluated. (Results shown to the left of the broken line in the diagram).

Figure 7:
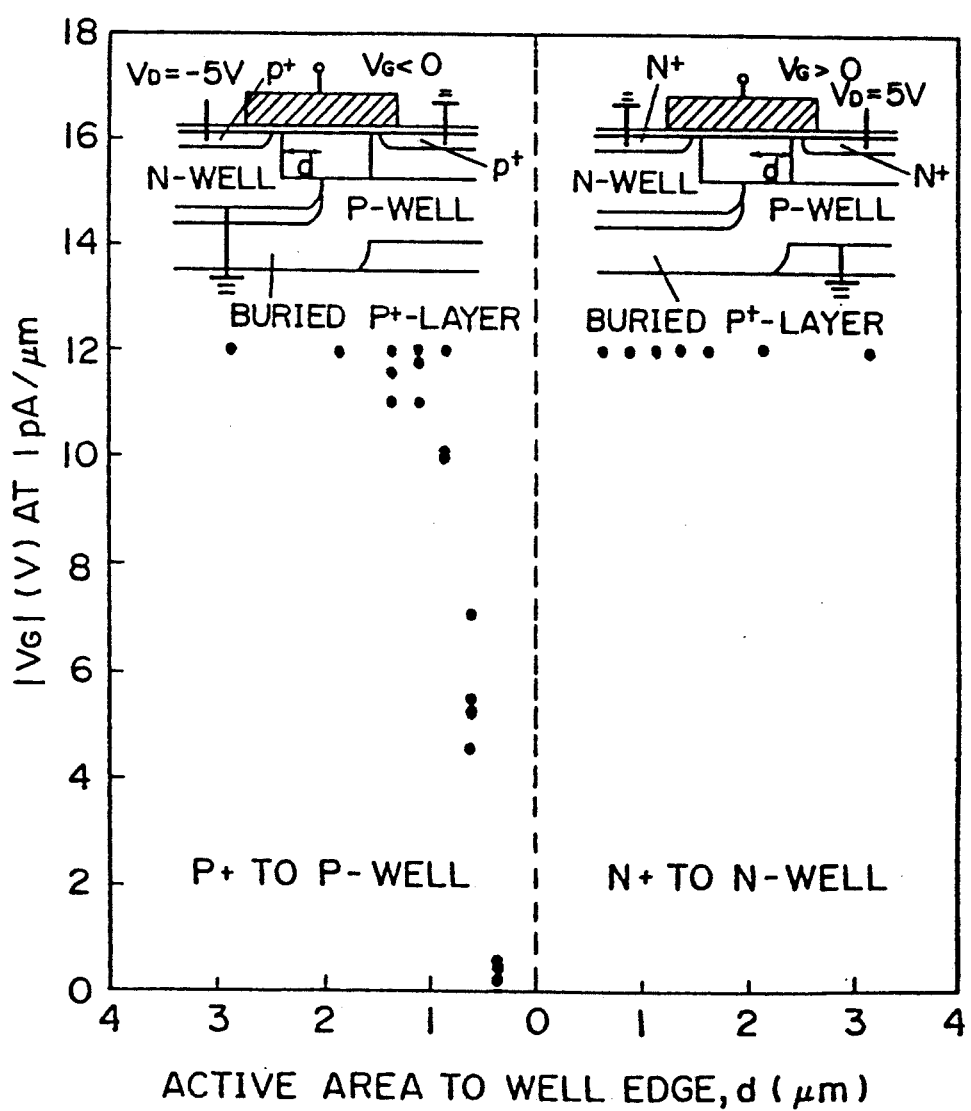
FIG. 7 shows transistor characteristics, for evaluating the properties of a channel stop that is formed directly below an insulating isolation layer of the test sample.

In that portion of FIG. 7, values of gate voltage of the stray p-channel transistor (at which a current of 1 pA flows for a gate width of 1 μm) are plotted along the vertical axis, while values of separation distance between the p-well and the p+ layer are plotted along the horizontal axis. From the test results, it is shown that the current is held to a very low value, for an amount of separation distance as low as 0.85 m and a gate voltage of up to 10 V. (2) Respective n+ layers were formed at both sides of the insulating isolation layer, extending over the respective wells, and a polysilicon gate layer was formed over the insulating isolation layer. The action of the n-channel stop region (p+) formed within the p-well, directly below the insulating isolation layer, was then evaluated. (Results shown to the right of the broken line in the diagram).

These results similarly shown that the channel stop region action is effective, with a gate voltage of up to 12 V, with a minimum separation distance of 0.65 m approximately. This is due to the high concentration buried layer that is disposed immediately below the n+ layer of the n-well, which ensures extremely good characteristics and is one of the important features of the present invention.

From the above, it can be understood that a satisfactory level of channel stop action is attained, for a value of separation distance as small as approximately 0.85 μm (in the case of the n-well side) and 0.65 μm (for the p-well side). Thus, a separation distance of approximately $(0.85+0.65)=1.5$ μm is possible (i.e. the spacing between the p+ layer in the n-well and the n+ layer in the p-well). The maximum value of gate voltage was limited to 12 V in the tests, in order to prevent breakdown of the gate oxide layer. However an excellent separation characteristic is obtained, so that if the structure is optimized, a spacing of approximately 1.0 μm will be possible.

FIG. 8 shows the results of measurements relating to latch-up of the CMOS structure. Values of current at which latch-up begins (for the case in which a trigger current is injected from the drain region (p+) of the p-channel transistor formed at the n-well) are plotted along the vertical axis, while the spacing between the n+ in the p-well and the p+ in the n-well is plotted along the horizontal axis. Within the evaluation circuits corresponding to FIG. 8, when a current flows through the stray pnp transistor (where the p, n and p are respectively the source and drain regions of the p-channel transistor, the n-well, and the p-well ), that current then flows into the low dopant concentration substrate (p) and the high concentration buried layer (p+), which present a sheet resistance Rs. A potential increase thereby developed in that sheet resistance Rs.

Due to this rise in potential, the potential of the virtual base (the p-well) of the stray npn transistor occurs (where the N, P and N of that transistor respectively consist of the drain region of the n-channel transistor, the p-well, and the n-well). This stray npn transistor is thereby turned on, and the resultant current flow causes a potential increase across the sheet resistance Rw of the n-well, whereby the potential of the virtual base (the n-well) of the stray pnp transistor occurs. Thus, the stray thyristor that is formed by the stray pnp and npn transistors is turned on.

Thus, the lower the value of Rs, the greater will be the latch-up withstanding capability. As is shown in FIG. 8, the greater the implantation amount (dose amount), the better will be the characteristics in that respect by comparison with a prior art structure in which only a retrograde n-well is used, it has been found that by using a boron dose of $3.0 \times 10^{12}$ cm$^2$, an increase in resistance to latch-up by a factor of approximately 7 times is achieved by the invention. If the boron dose is $7.0 \times 10^{12}$ cm$^2$, an increase in resistance to latch-up by a factor of approximately 14 times is achieved. This increase in resistance to latch-up results from the fact that the value of Rs in a prior art structure having only a retrograde well is much higher than in the case of the present invention.

Figure 8B:
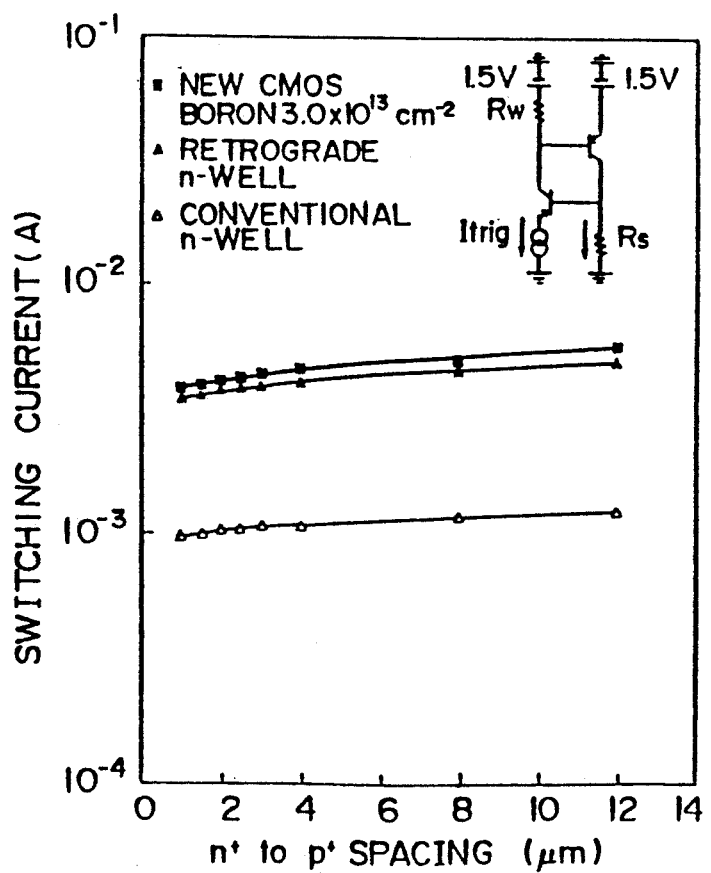

In addition, as shown in FIG. 8(b), highly effective resistance to latch-up can be achieved by using a retrograde n-well having a very low value of sheet resistance Rw, and a p-well having a low value of sheet resistance together with a high concentration buried layer (p+) which has a low value of sheet resistance Rs. In this case, since the sheet resistance Rw of the retrograde n-well is a distributed resistance, the triggering mechanism is such that the resistance to latch-up is similar to that of a prior art structure having a retrograde n-well configuration. However the resistance to latch-up is improved by approximately a factor of 4 times by comparison with a standard n-well structure.

Thus, with a structure according to the present invention as described above, approximately the same degree of latch-up initiating current is obtained, for either source of the latch-up triggering, and the structure provides a satisfactory resistance to latch-up. Furthermore it has been confirmed that these characteristics are obtained, as shown in FIG. 7, even for a very small amount of n+ - p+ separation distance, i.e 1.0 to 1.5 μm. With the present so-called 1.0 μm design rule, that separation distance is can be no more than approximately 6.0 μm. It can thus be understood that the present invention has considerable manufacturing value.

Second Embodiment

FIGS. 8 and 9 show a second embodiment of a method for controlling the respective depths of the deep and shallow regions of the high concentration buried layer (p+). With this embodiment, two films are formed, having respectively different degrees of implantation stopping power, and profile control is executed with dopants being implanted from above these layers. In FIG. 9, numeral 11 denotes a n-well, 12a denotes a high concentration buried layer (p+), 13 denotes a low dopant concentration substrate (p), 14 denotes a protective oxide film, 15 denotes an insulating film having a stopping power $\Delta 1$, 16 denotes a photoresist layer having a stopping power $\gamma 2$.

Figure 9A:
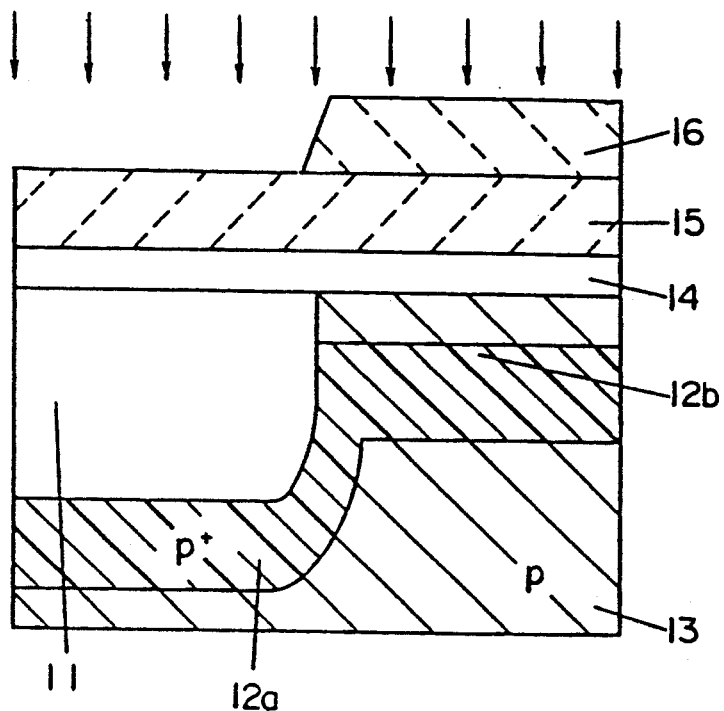
FIGS. 9a–9b show cross-sectional views to illustrate a manufacturing process for a second embodiment of a semiconductor device according to the present invention.

Firstly, as shown in FIG. 9(a), the protective oxide film 14 for control of ion implantation is formed by thermal oxidation of the low dopant concentration substrate (p) 13. An insulating film 15 is then formed over the oxide film, for example an NSG film to a thickness of approximately 1.0 μm, formed by CVD. Next, the photoresist layer 16 is formed over the insulating film, to a thickness of approximately 0.7 μm, then patterning of the photoresist layer is executed, with a specific degree of edge taper of the patterned layer being produced. Next, as shown in FIG. 9(a), implantation of boron into the entire wafer is performed, from above the three superimposed layers, (acceleration voltage of 2.0 MeV, and dose of $3.0 \times 10^{13}/cm^2$) When this is done, a p-well 12b and a shallow high concentration buried layer (p+) (acting as an n-channel stop region) are formed within the region that is covered by the photoresist. At the same time, a deeply located high concentration buried layer (p+) 12a is formed in the region that is not covered by the photoresist 16.

Figure 9B:
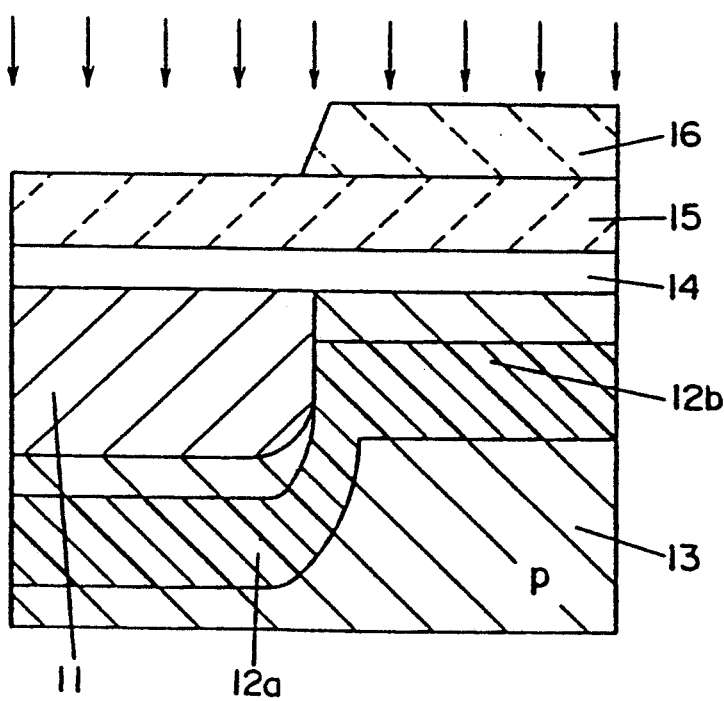

As shown in FIG. 9(b), implantation of phosphorus into the three superimposed layers is then executed, without removing these layers (with acceleration voltage of 700 KeV, and dose of $1.0 \times 10^{13}/cm^2$), to thereby form the n-well 11.

Thus, one feature of this embodiment of a manufacturing process according to the present invention is that an insulating film and a photoresist layer having respectively different degrees of stopping power are successively superimposed, and then implantation of phosphorus to form an n-well and implantation of boron to form a high concentration buried layer are successively executed, without removing the superimposed layers. As a result of the presence of the three successively superimposed layers, implantation of the phosphorus is completely prevented within the region that is covered by these layers, thereby selectively forming the n-well. On the other hand, the boron passes through the three successively superimposed layers, to thereby form regions of a specific conduction type at respectively different depths. Furthermore, the n-well and p-well are formed in a self-aligned manner.

In addition, the thickness of each layer, e.g. the photoresist layer, can be made very small, so that the coating processing can produce an even film thickness over the entire wafer area.

Another feature of this embodiment will be described referring to FIG. 10, which shows the results of computer simulation for illustrating how control can be executed to selectively place the high concentration buried layer (p+) in a shallow region and a deep region with this manufacturing process. In this case an NSG film having a stopping power $\gamma 2 = 1.0$ is formed as an insulating film upon a protective oxide film which has a stopping power $\gamma 1 = 1.0$. A layer of photoresist is then formed, with a stopping power $\gamma 3 = 0.88$, and boron implantation is then executed (with acceleration voltage of 2.0 MeV, and dose of $3.0 \times 10^{13}/cm^2$).

Broadly speaking, the following relationships exist between the deep position RP1 and the shallow position RP2 of peak dopant concentration of the buried layer, the thickness L1 of the oxide film, the thickness L2 of the NSG film, and the thickness L3 of the photoresist layer:

$$RP1 = RP - (\gamma 1 L1 + \gamma 2 L2 + \gamma 3 L3) \tag{1}$$

$$RP2 = RP - (\gamma 1 L1 + \gamma 2 L2) \tag{2}$$

In the above, RP is the peak concentration of the boron resulting from the aforementioned implantation within the semiconductor substrate. From the above, the difference d in depth between the two high concentration buried layers 12a and 12b is obtained as:

$$d = \gamma 3 \, L3 \tag{3}$$

Thus to reduce the value of d, it is necessary to reduce the stopping power $\gamma 3$, or to reduce the film thickness L3. However this may make it difficult to obtain complete obstruction of phosphorus ions, as is required in forming the n-well.

Thus, the thickness of the intermediate layer having the stopping power of $\gamma 2$ (which must be an NSG film in this case) can be set independently of the value of d.

Furthermore, by adjusting the thickness of the NSG film, the overall depth of the high concentration buried layer can be varied. This type of control is especially important in the case of a manufacturing process which used high-energy implantation, since the higher the energy that is used, the longer will become the wafer processing time, and this results in a reduction of throughput.

Figure 10:
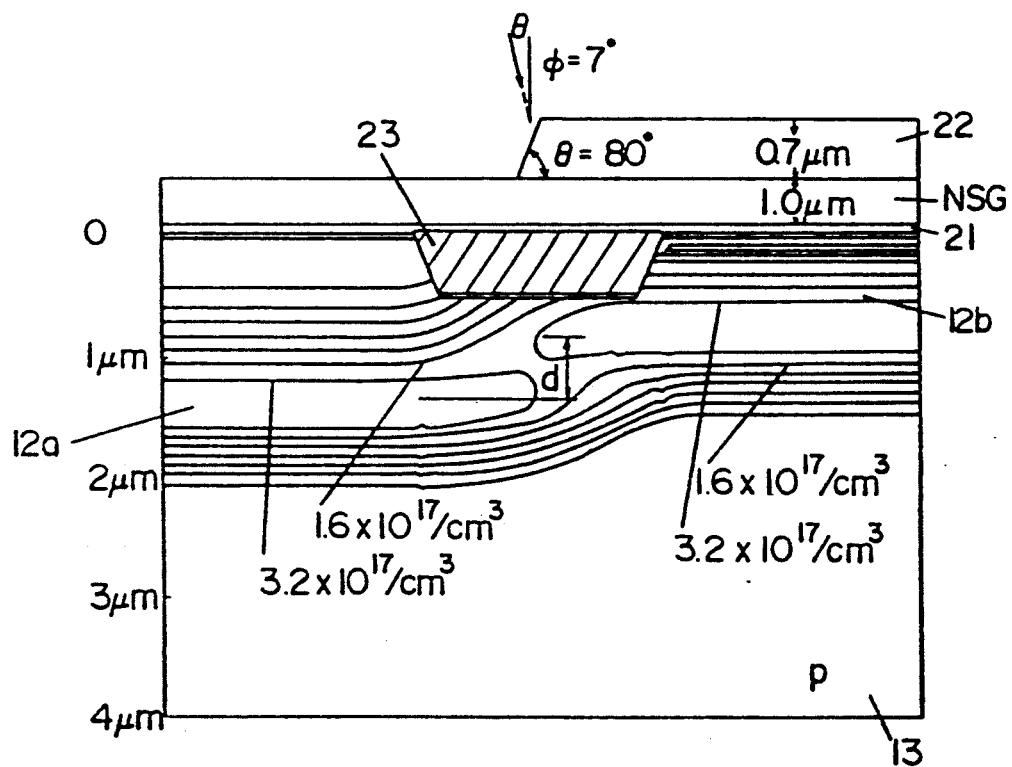
FIG. 10 is a dopant concentration contour line diagram, showing 2-dimensional distributions of dopant within the substrate, obtained by computer simulation of the manufacturing process for the second embodiment of a semiconductor device according to the present invention.

As shown in FIG. 10, the shallow high concentration buried layer (p+) has a peak dopant concentration of $3.2 \times 10^{17}/cm^{-3}$, with the position of peak dopant concentration being approximately 0.8 $\mu$m from the surface, while the deep high concentration buried layer (p+) has a peak dopant concentration of $3.2 \times 10^{17}/cm^{-3}$, with the position of peak dopant concentration being approximately 1.4 $\mu$m from the surface. Thus, the difference between the peak positions is approximately 0.6 $\mu$m. In addition, the dopant concentration of the connecting portion that is disposed below the insulating isolation layer is extremely high (i.e. $1.6 \times 10^{17}/cm^{-3}$).

Furthermore, by using three or four successively superimposed layers having respectively different values of stopping power, it would be possible to optimize the wells and the high concentration buried layer (p+).

Third Embodiment

Figure 11:
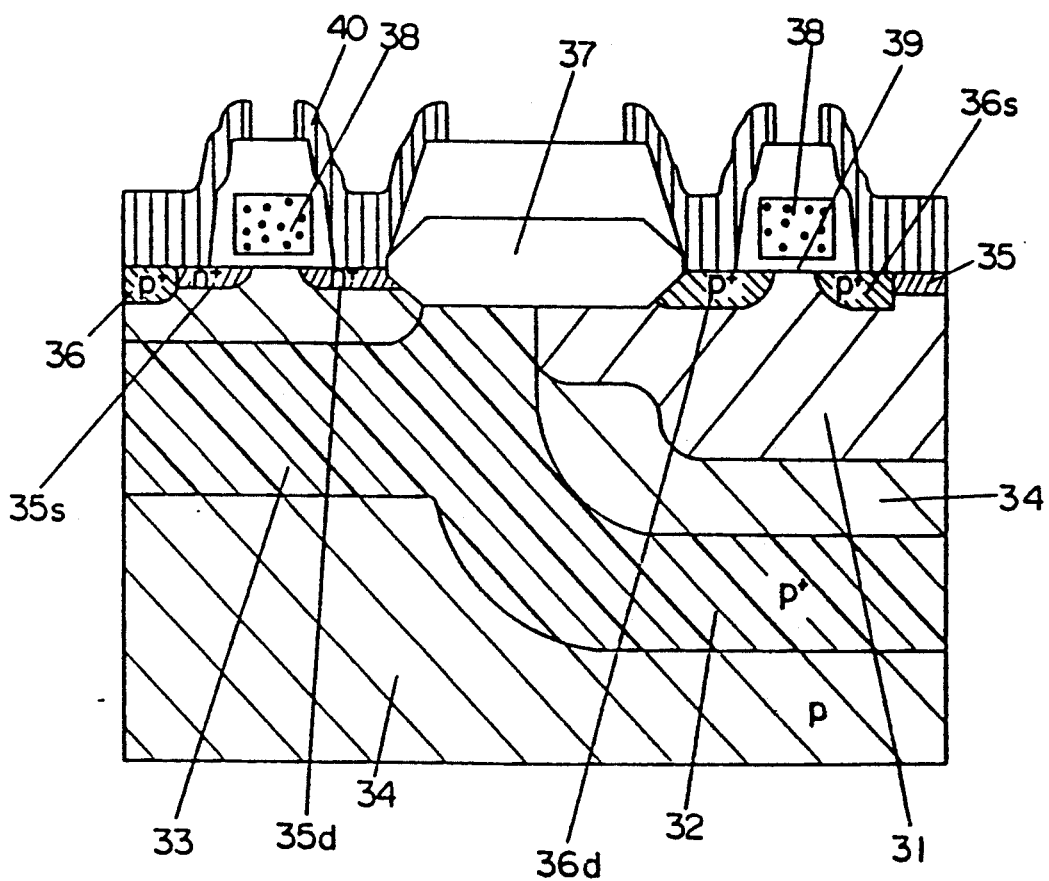
FIG. 11 shows a cross-sectional view in elevation of a third embodiment of a semiconductor device according to the present invention.

Another embodiment will be described referring to FIGS. 11 to 14. In FIG. 11, 31 denotes an n-well, 32 denotes a high concentration buried layer (p+), 33 denotes a p-well that is formed extending continuously with the high concentration buried layer 32, 34 denotes a low dopant concentration semiconductor substrate (p), 35, 35s, 35d denote respective p+ layers, 36, 36s, 36d denote respective p+ layers, 37 denotes an insulating isolation layer, 38 denotes a gate electrode, 39 denotes a gate oxide film, and 40 denotes aluminum connecting leads.

One specific feature of the structure of FIG. 11 is that a part of the insulating isolation layer 37 protrudes above the surface of the semiconductor substrate Other features of the structure of FIG. 11 are identical to those of the first embodiment, so that the following results are obtained. The potential of the semiconductor substrate can be easily fixed from the substrate surface, i.e. by fixing the potential of the p-well 33 from the surface, the substrate potential is automatically determined. As a result, the high concentration buried layer 32 effectively absorbs holes that are injected in the depth direction or in the lateral direction into the low dopant concentration substrate 33 through the n-well 31 from the p+ layer 36d which forms the drain region of the p-channel transistor. Thus, stray npnp thyristor operation is suppressed.

The n-well 31 and p-well 33 are formed in a self-aligned manner, and hence almost no compensated region is formed directly below the insulating isolation layer (i.e. no region that is compensated by the n-type dopant which forms the n-well 31 or the p-type dopant which forms the p-well 33). Hence, this self-aligned feature enables the element spacing to be easily reduced.

It is also a feature of this embodiment that the depth of the peak concentration of the shallow portions of the n-well 31 and the p-well 33 that are disposed directly below the insulating isolation layer 37 (and function as a channel stop) is different from the depths of the peak concentration in each of the retrograde well regions. For that reason, this embodiment provides greater structural freedom than the first embodiment.

Figure 12A:
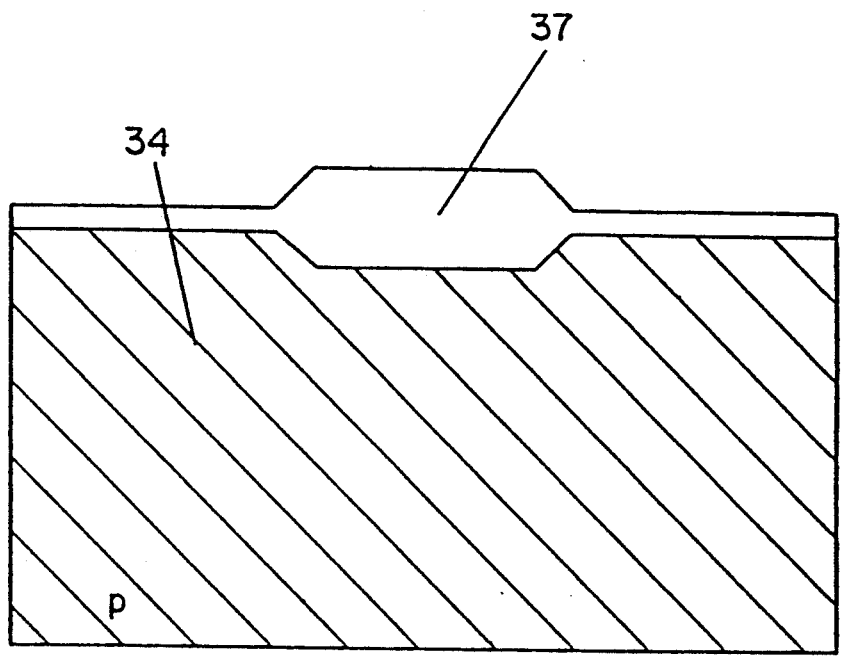
FIGS. 12a–12d show partial cross-sectional views illustrating the manufacturing process of the third embodiment.

An example of a manufacturing process for this embodiment will be described referring to FIGS. 12(a) to (d). Firstly as shown in FIG. 12(a), the insulating isolation layer 37 is selectively formed on the low dopant concentration semiconductor substrate (p) 34. Part of the insulating isolation layer 37 is formed in the semiconductor substrate, while the remaining part is formed protruding above the substrate surface. This configuration can be achieved through thermal oxidation using the LOCOS method. However in that case it is necessary to form the insulating isolation layer prior to executing implantation to form the wells. Moreover if an extremely small degree of element spacing is to be achieved, this can be facilitated by producing the insulating isolation layer by first forming grooves in the substrate surface by etching, embedding the insulating material in the grooves, and then depositing further insulating material onto the portions embedded in the grooves.

Figure 12B:
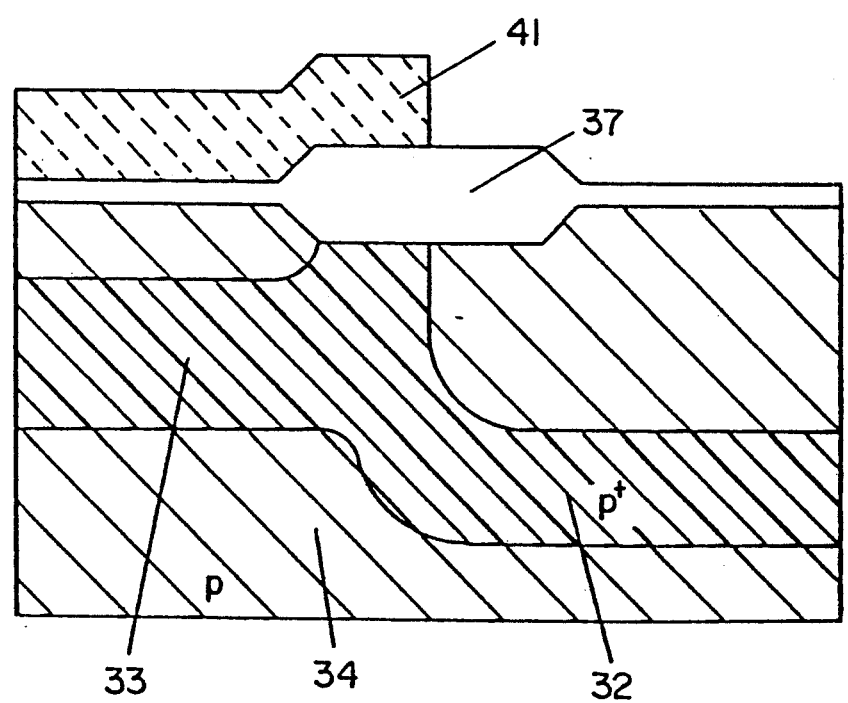

Next, as shown in FIG. 12(b), a film of photoresist 41 is formed on the substrate surface, and is patterned. In this example the photoresist film has a thickness of approximately 2 $\mu$m, and the ion implantation stopping power of the photoresist film is approximately 0.82. Using such a film thickness and high-energy implantation of boron to form the high concentration buried layer 32 (with acceleration voltage of 1.7 MeV, and dose of $3.0 \times 10^{13}/cm^2$), a deep high concentration buried layer (p+) 32 is formed in the region that is not covered by the photoresist, while at the same time a p-well 33 is formed in the region that is covered by the photoresist, due to penetration of ions through the photoresist film 41. As described hereinafter, the thickness of the photoresist film 41 is such as to completely block the phosphorus ions during implantation that is executed to form the n-well.

By forming a well by high-energy implantation in this way, it becomes possible to form a high concentration buried layer in a region that is substantially deeper than the region near the surface of the semiconductor substrate in which transistors will be subsequently formed by high-temperature processing. As a result, the potential of the wells can be fixedly determined, and any CMOS latch-up trigger current can be suppressed.

Due to the ion implantation blocking capability of the insulating isolation layer 37, a layer is formed directly below the insulating isolation layer 37 which has a dopant profile that is more shallow than those of the p-well 33 and the high concentration buried layer (p+) 32. That layer which is formed directly below the insulating isolation layer 37 functions as a channel stop.

Figure 12C:
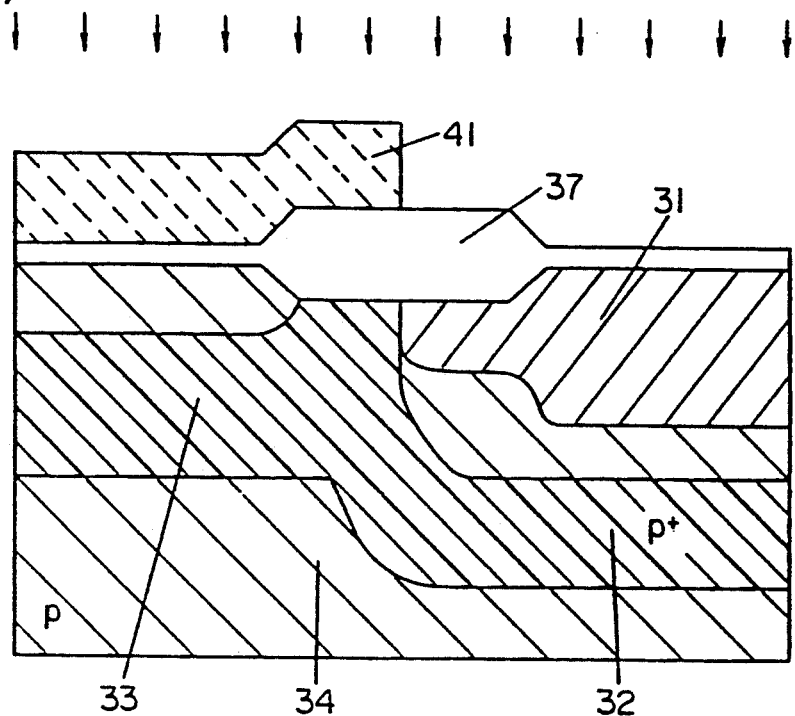
Figure 12D:
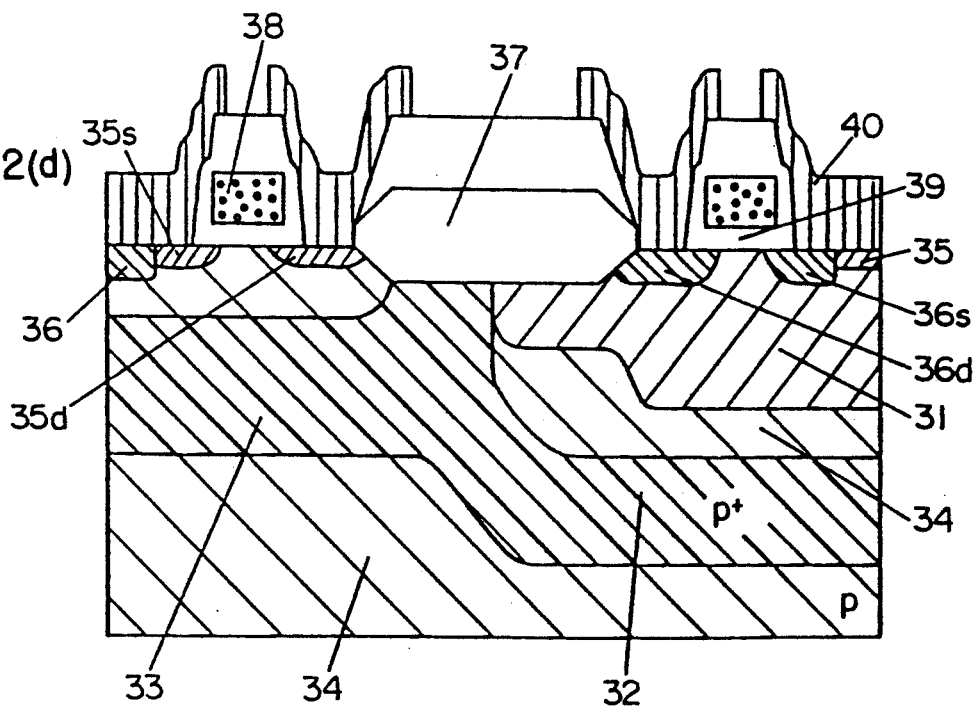

Next, as shown in FIG. 12(c), without removing the photoresist pattern, phosphorus implantation is performed over the entire area of the wafer, (with acceleration voltage of 900 KeV, and dose of $1.5 \times 10^{13}/cm^2$) to thereby form the n-well, positioned higher than the high concentration buried layer (p+) 32. At this time, a high concentration layer is formed directly below the insulating isolation layer 37, which has a peak concentration value at a depth that is more shallow than the depth of peak concentration of the shallow n-well 31. This shallow layer portion that is formed directly below the insulating isolation layer 37 serves as a channel stop. Using the usual processing, a gate oxide film 39, gate electrode 38, n+ layer 35, p+ layer 36, and aluminum connecting leads 40 are then formed, to obtain the complementary semiconductor device.

Figure 13:
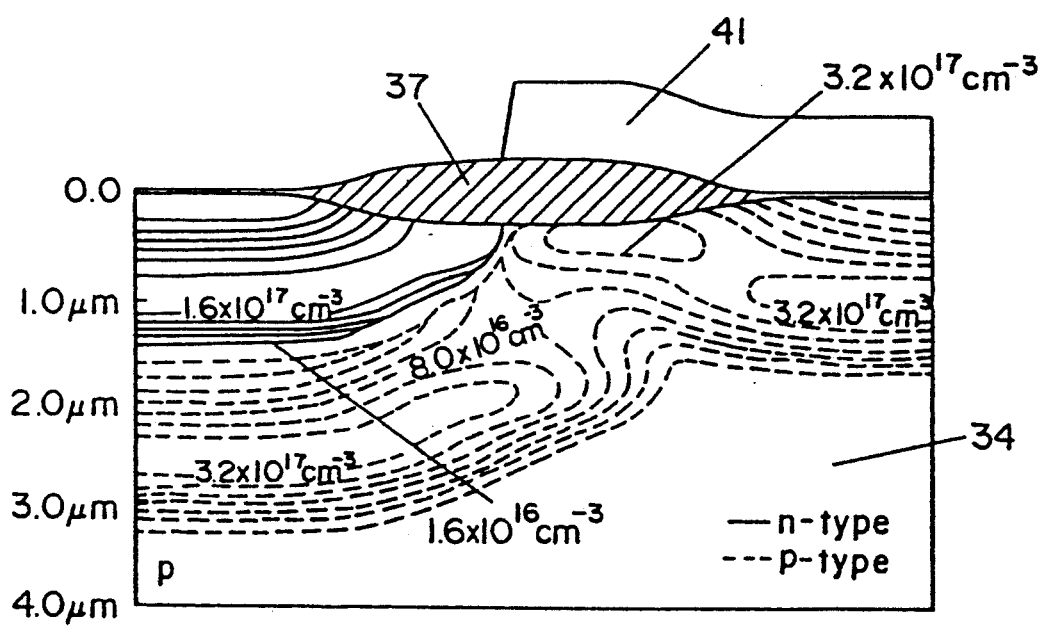
FIG. 13 is a dopant concentration contour line diagram, showing 2-dimensional distributions of dopant, obtained by computer simulation of an implantation condition of a manufacturing process for the semiconductor device of the third embodiment.

The above is a summary of the manufacturing process. FIG. 13 shows an example of the resultant dopant distribution in a device manufactured by that manufacturing process, obtained by computer simulation. The results in FIG. 13 have been obtained assuming the following values: photoresist film thickness=1.9 $\mu$m, stopping power of the photoresist film=0.82, photoresist taper angle=85°, implantation angle 7°, acceleration voltage=900 KeV, dose=1.5×10$^{13}$ for phosphorus, acceleration voltage=1.7 MeV, dose=3×10$^{13}$ for boron, and annealing for 2 hours at 1050° C. FIG. 13 shows the simulated profiles of the n-type and p-type dopants in the device.

As shown, the high concentration boron distribution corresponds to a p-well 33, having a peak concentration value of 3.2×10$^{17}$/cm$^3$, positioned approximately 1 μm below the surface, a high concentration buried layer 32 having a peak concentration value of 3.2×10$^{17}$/cm$^3$, positioned approximately greater than 2 μm and less than 3 μm below the surface, and a layer having a concentration of greater than 3.2×10$^{17}$/cm$^3$ which is positioned directly below the insulating isolation layer 37.

The distribution of the high concentration phosphorus similarly indicates that an n-well 31 is formed over the high concentration buried layer 32, having a peak concentration value of 1.6×10$^{17}$/cm$^3$, positioned approximately 1 μm below the surface, while a high concentration phosphorus region is formed directly below the insulating isolation layer 37. It can also be understood that the p-well 33 and the high concentration buried layer 32 extend continuously, (with the concentration value of 4×10$^{16}$/cm$^3$ shown in the drawing).

In particular, a channel stop having a very high dopant concentration can easily be formed directly below the insulating isolation layer 37. That is to say, a certain degree of freedom is obtained for forming one high dopant concentration layer (whose value of peak dopant concentration is that of the retrograde well) at an optimum depth, and forming another high dopant concentration layer (which has a peak concentration value at a position directly below the insulating isolation layer) at an optimum depth for functioning as a channel stop.

Figure 14:
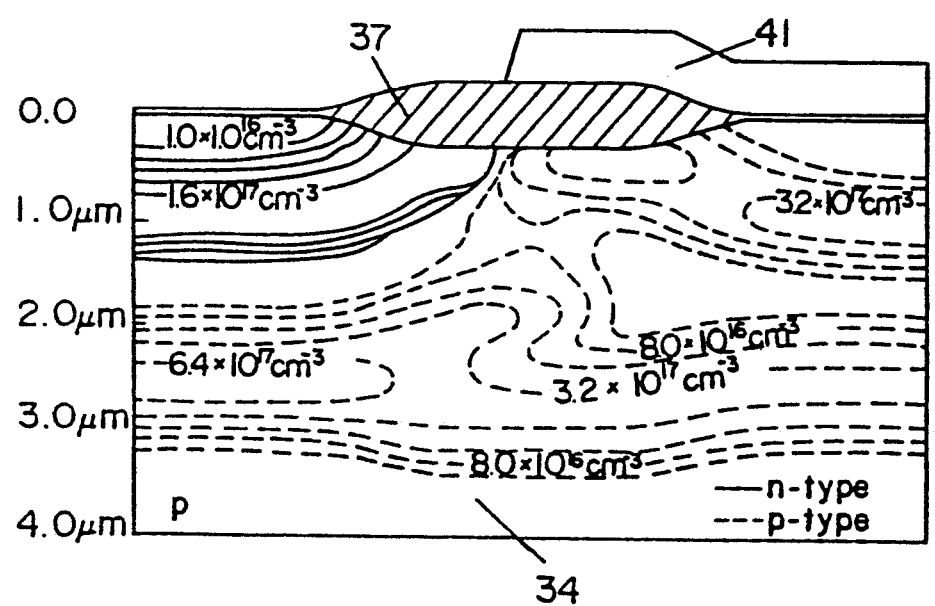
FIG. 14 is a dopant concentration contour line diagram, showing 2-dimensional distributions of dopant, obtained by computer simulation of another implantation condition of a manufacturing process for the semiconductor device of the third embodiment.

FIG. 14 shows simulation results obtained for the case in which boron implantation is executed over the entire wafer, (with acceleration voltage of 1.7 MeV, and dose of 3.0×10$^{13}$/cm$^2$), followed by annealing at 1050° C. for 2 hours, and with the same processing being executed thereafter as for FIG. 13. It can be seen that a buried layer is formed which has a dopant concentration that is higher than the peak concentration value of the p-well, i.e. with the buried layer having a peak concentration of 6.4×10$^{17}$/cm$^3$ at a distance from the surface of approximately 2.5 μm.

Usually, high-energy implantation results in point defects being produced, if the dose exceeds 1×10$^{14}$/cm$^2$, and it is known that it is difficult to eliminate these point defects by thermal processing. However if a low-dose implantation is used, and thermal processing is performed repetitively a number of times in succession, then a high concentration buried layer can be formed as shown in 14, and the resistance to CMOS latch-up is further enhanced.

Figure 15:
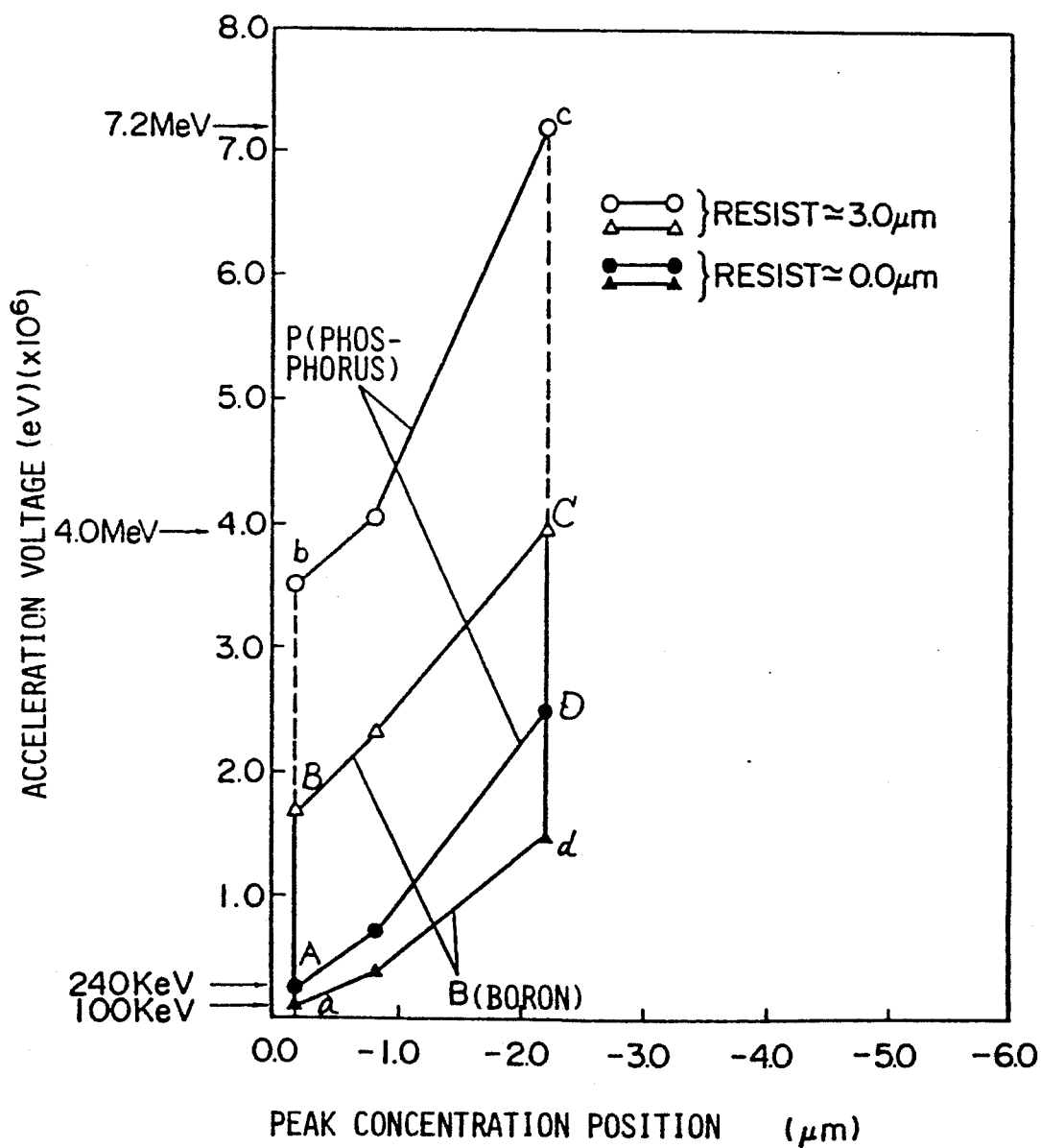
FIG. 15 is a graph showing the implantation conditions for high-energy implantation with the present invention.

FIG. 15 is a characteristic diagram showing the permissible limits of the conditions for high-energy implantation of phosphorus and boron as described above. The limiting conditions on the manufacturing method for a complementary semiconductor device according to the present invention can be broadly divided into two, i.e.:

(1) Firstly, the implantation conditions for forming a retrograde well in a region that is not covered by the photoresist.

For example, if phosphorus implantation is executed to form an n-well, then in order to prevent contact with the p+ layer of a transistor source or drain region, it is necessary establish a peak concentration of the n-well at a position which is at least 2.5 μm below the substrate surface. This condition is represented as point A in the diagram. The implantation condition for boron in this case are indicated as point B in the diagram.

(b 2) If the acceleration voltage is high, then an implantation condition occurs whereby a retrograde well is formed even in an area which is not covered by the photoresist.

In that case, the peak dopant concentration of the high concentration layer will occur deep within the substrate, and the concentration of both the n-well and the substrate surface will be low. However, since the dopant concentration at the substrate surface is a controlling condition of the transistor threshold voltage Vt, it is necessary that this dopant concentration be held at a minimum value of approximately 1.0×10$^{15}$/cm$^3$. The more the implantation amount is increased, the greater will be the depth at which the n-well is formed. However in order to prevent the generation of point defects as a result of the implantation, it is necessary to hold the amount to approximately 1.0×10$^{18}$/cm$^3$ or less. The peak value that represents that condition is indicated as point D in the diagram. The corresponding condition for boron implantation is indicated as point C.

In the above, the invention has been described for the case of an n-well being formed in a region which is not covered by photoresist. However the limits of the implantation conditions for the opposite case, i.e. in which a p-well is formed in a region which is not covered by photoresist, are indicated by points a, b, c, d in the diagram. In this case, phosphorus must be deeply implanted, so that an extremely high value of acceleration energy is required.

In the diagram, the values have been computed assuming a maximum thickness of 3.0 μm for the photoresist film. This thickness is used in order to prevent problems from arising in the semiconductor device manufacturing process, i.e. this is the maximum film thickness for ensuring that the photoresist will be evenly coated over the substrate.

Furthermore, in the description of the second embodiment of the invention, a film having a stopping power is coated over the entire substrate. In that case, the region which is surrounded by A, B, C and D in FIG. 15 will be shifted upward. That is to say, in this case the implantation conditions will be as follows: acceleration voltage of at least 240 KeV for the phosphorus implantation, with the difference between that acceleration energy and the implantation energy for boron implantation being no greater than 1.7 MeV (assuming that the layer of photoresist above each well has a maximum thickness of 3 μm.

Figure 16:
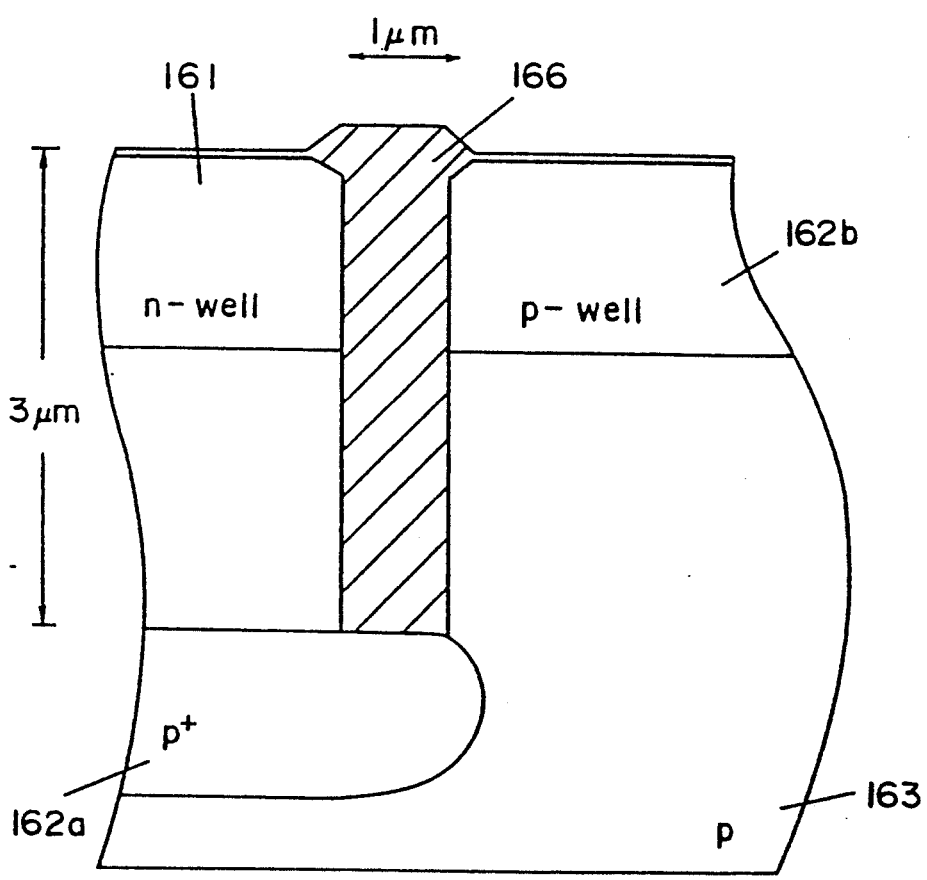
FIG. 16 is a partial cross-sectional view in elevation of a CMOS semiconductor device according to the present invention, formed by high-energy implantation.
Figure 17:
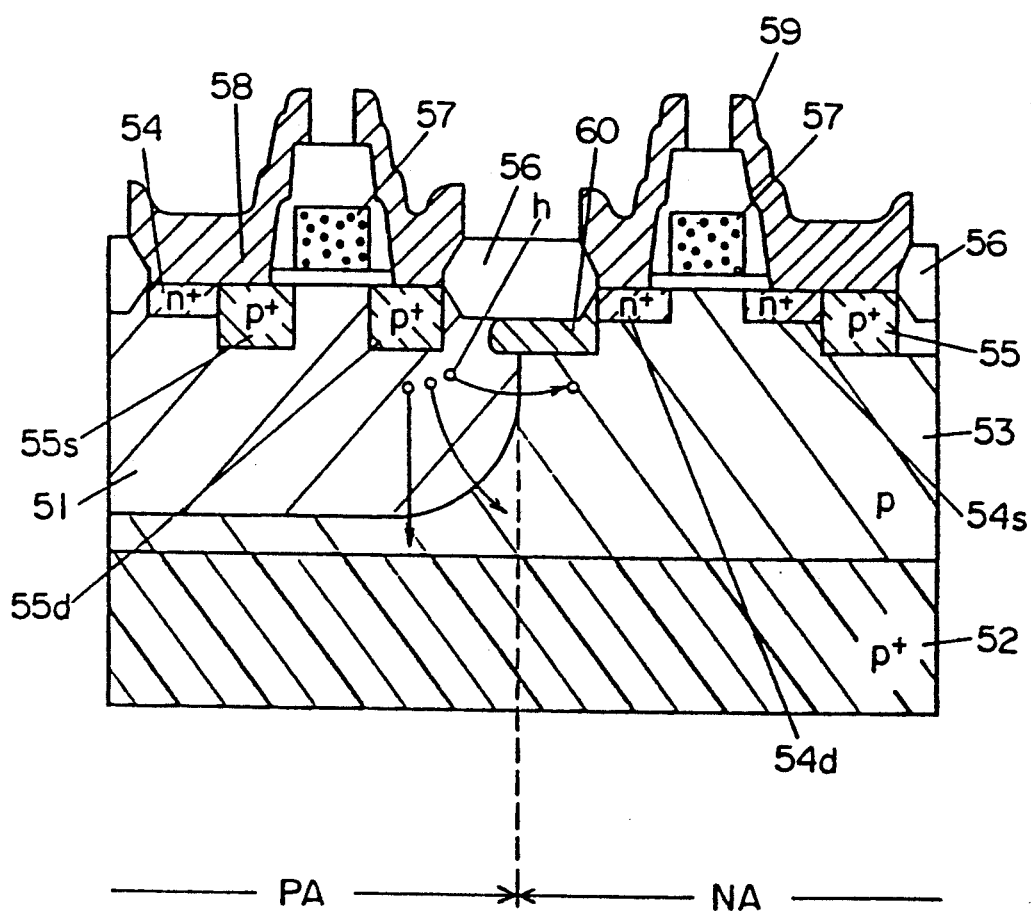
FIG. 17 is a cross-sectional view in elevation showing the structure of an example of a prior art semiconductor device.
Figure 18A:
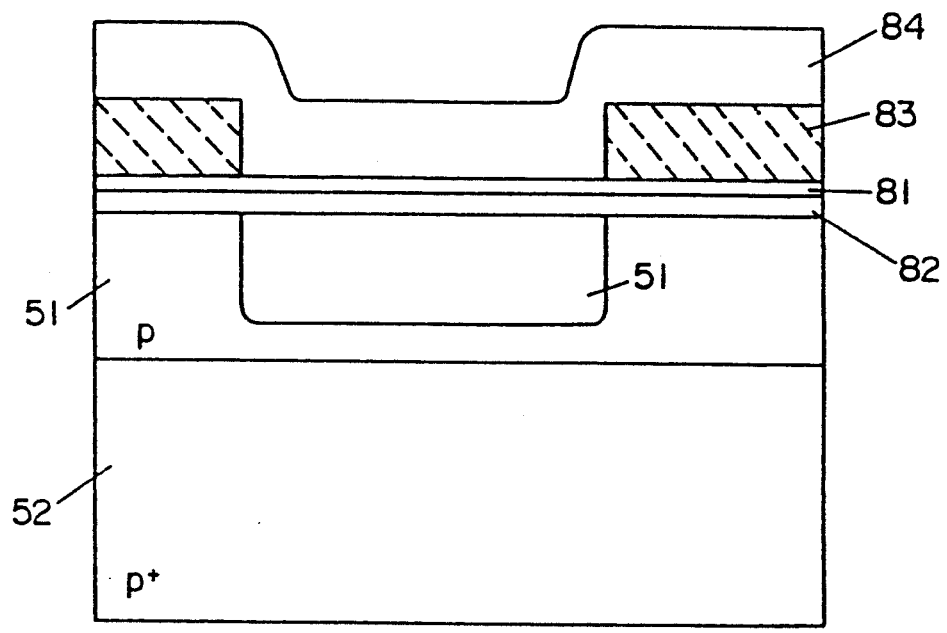
FIGS. 18a–18d show partial cross-sectional views illustrating the manufacturing process of the example of FIG. 17.
Figure 18B:
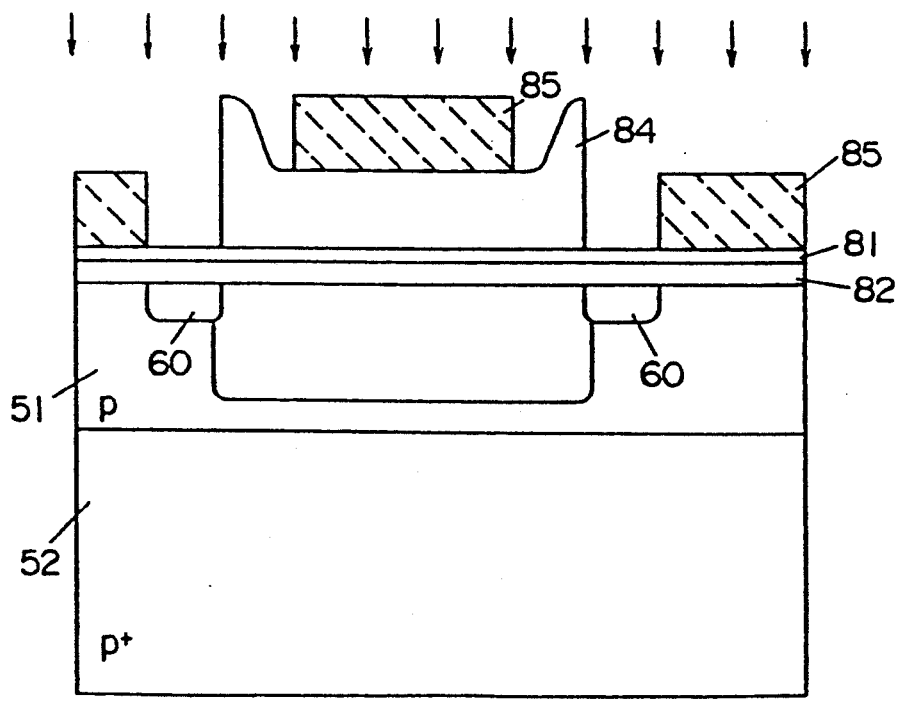
Figure 18C:
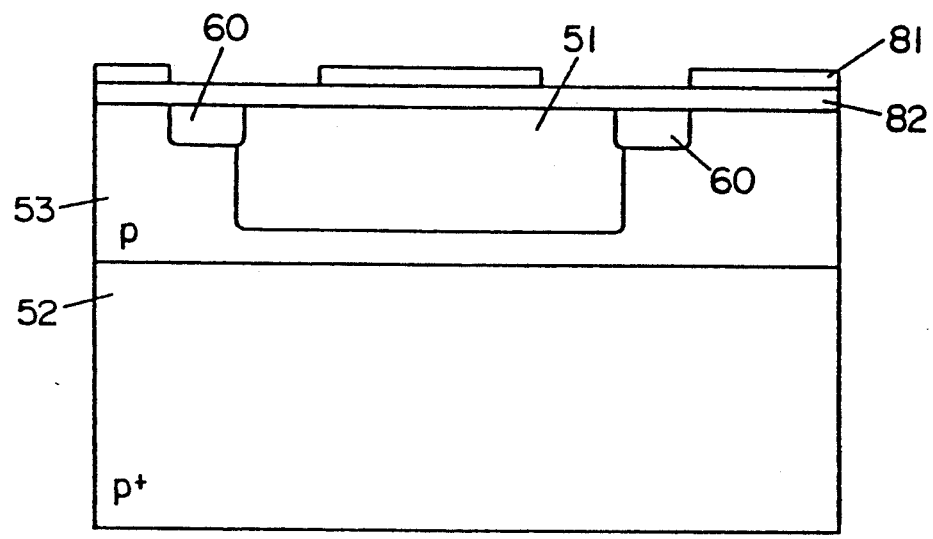
Figure 18D:
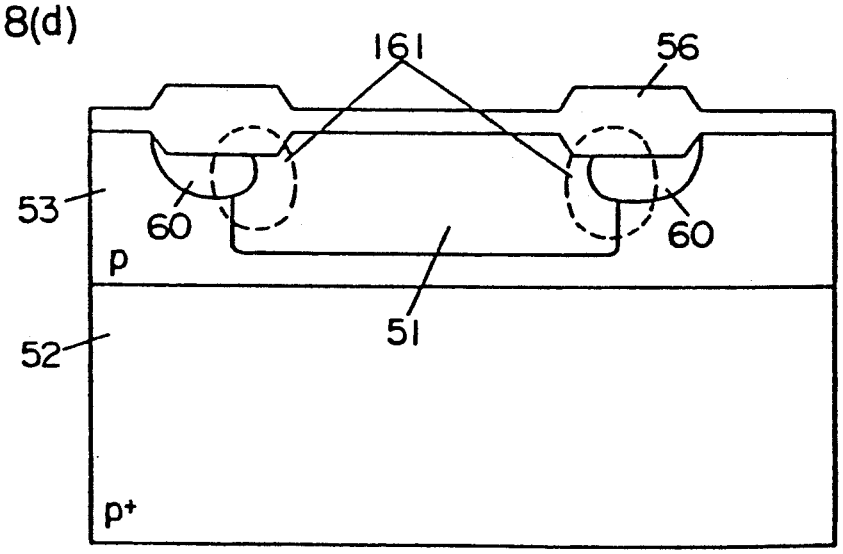
Figure 19:
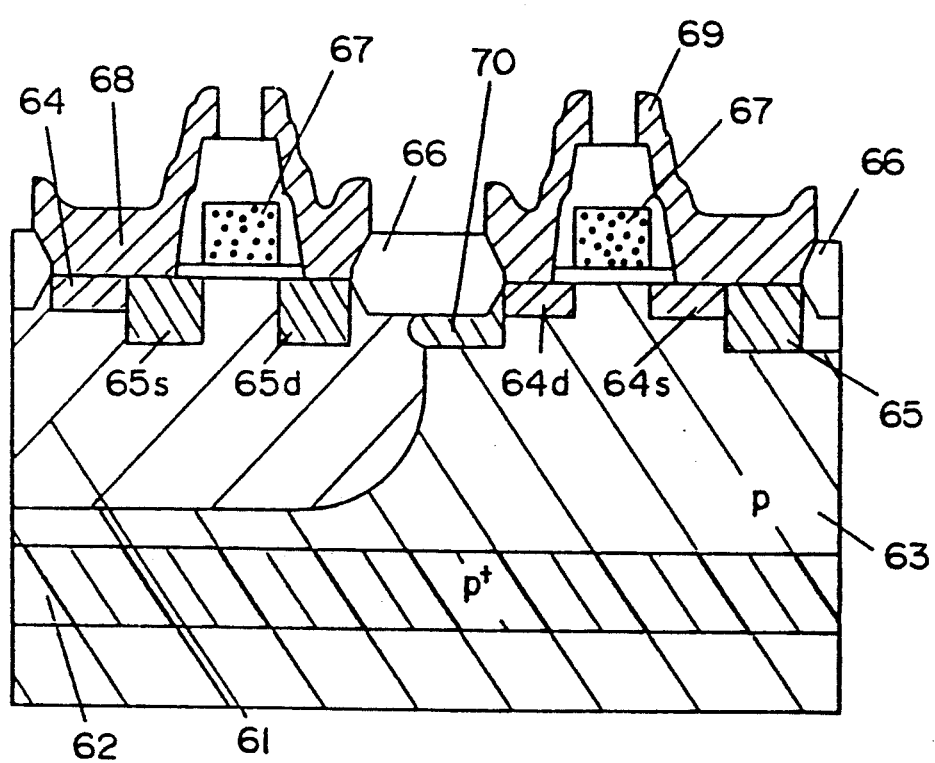
FIG. 19 is a cross-sectional view in elevation showing the structure of another example of a prior art semiconductor device.
Figure 20A:
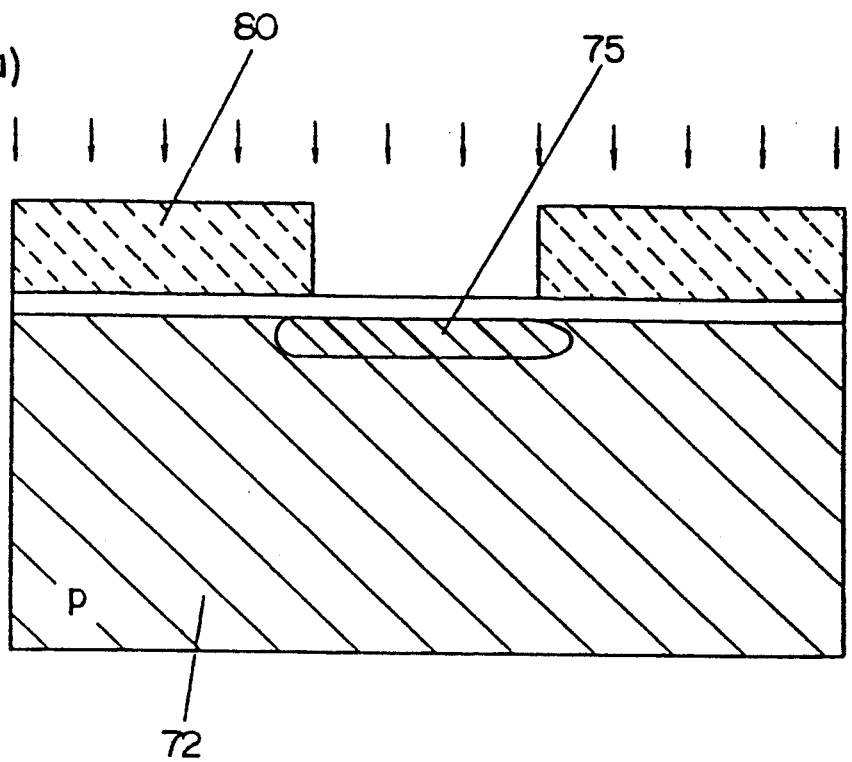
FIGS. 20a–20d show partial cross-sectional views illustrating the manufacturing process of a further example of a prior art semiconductor device.
Figure 20B:
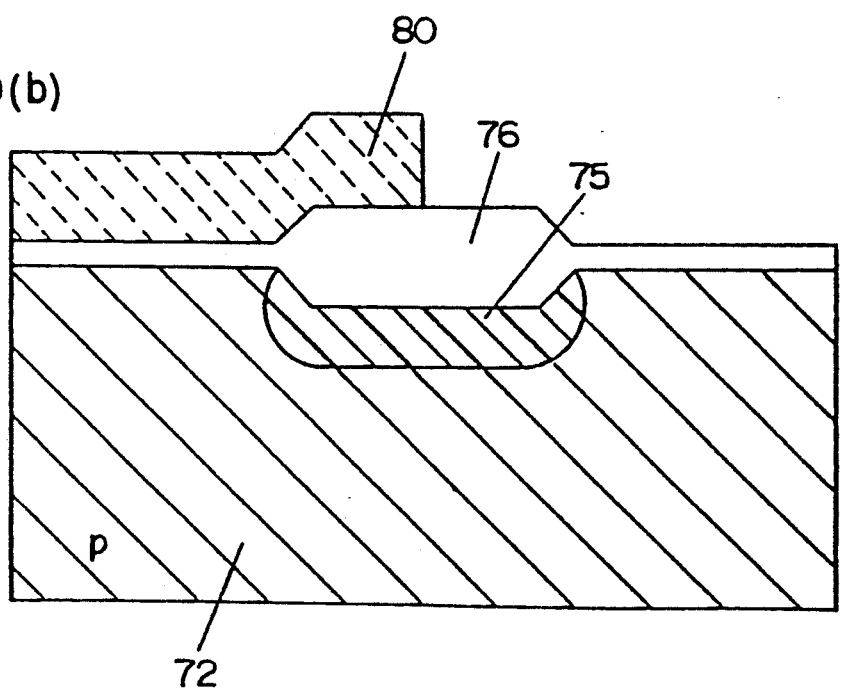
Figure 20C:
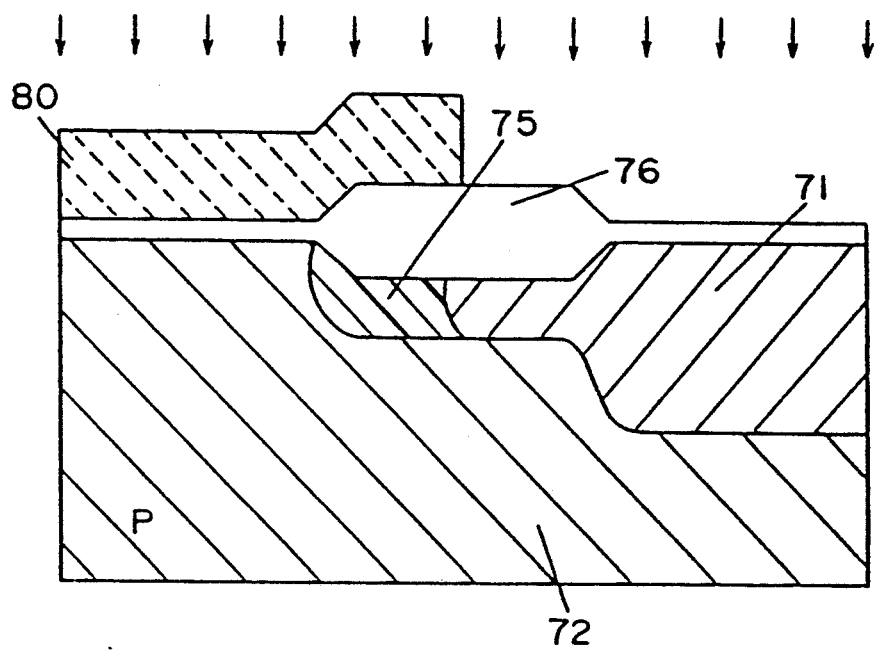
Figure 20D:
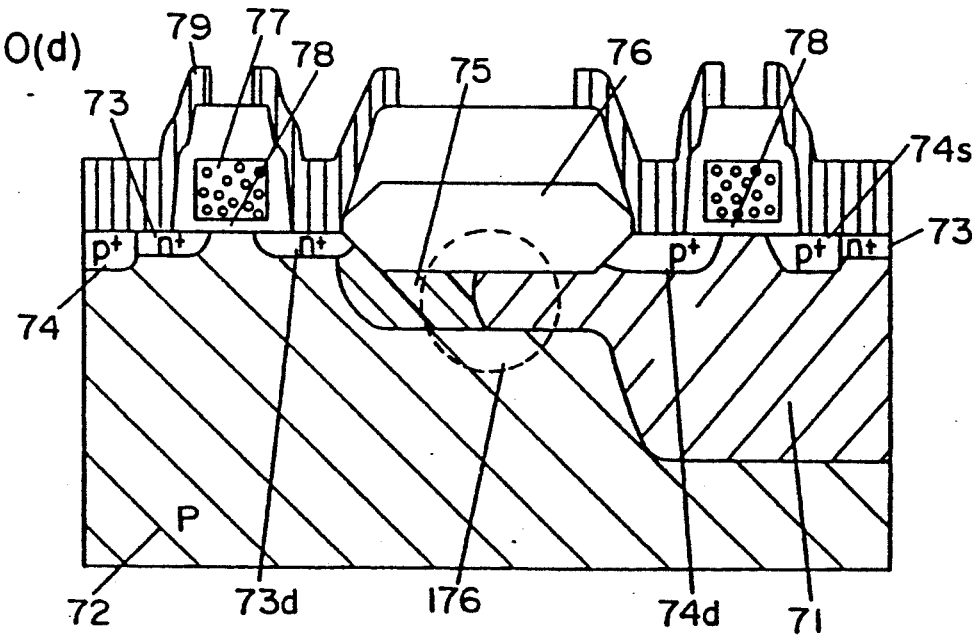

FIG. 16 shows another configuration, having a deep trench separation structure. This configuration does not fall within the previously described implantation conditions, however in this case too, the p-well 162b and the p+ buried layer 162a are formed by a single implantation operation. Since the n-well is completely isolated by means of the trench structure 166, it is not necessary to provide n+ below the trench 166.

Possibilities for Manufacturing Utilization

Only examples of the invention have been described in the above, however it can be understood that with a complementary semiconductor device according to the present invention, a high concentration buried layer is formed in a deep region of a semiconductor substrate, directly below an n-well, while a high concentration buried layer is formed in a shallow region surrounding the n-well within the semiconductor substrate, with the high concentration buried layer in the deep region and that in the shallow region being formed as one continuous layer. As a result, the potential of the high concentration buried layers can be easily set from the top of the semiconductor substrate.

Furthermore, injection from the n-well into the low dopant concentration substrate in the depth direction or in the lateral direction is effectively absorbed by the high concentration buried layers, so that trigger current of a stray thyristor is effectively suppressed.

Moreover, due to the fact that a shallow high concentration well of a first conduction type and a high concentration well of a second conduction type are formed directly below the insulating isolation layer, isolation is achieved without the need for a manufacturing process for producing a channel stop. As a result, the separation distance between the transistors of the first conduction type and second conduction type can be easily reduced.

Moreover, with the manufacturing method according to the present invention, firstly an n-well for forming a p-channel transistor and a p-well for forming an n-channel transistor are respectively formed in a self-aligned manner, using a single photoresist pattern. As a result, high concentration layers which function as a channel stop for both the p-well and n-well channels formed directly below the insulating isolation layer, at a position corresponding to an edge of the photoresist layer, with the abutment position of these high concentration layers being determined without the need for compensation. Due to the fact that shallow high concentration regions, consisting of a portion of an n-well and a portion of a p-well respectively, are formed directly below the insulating isolation layer at the same time as the wells are formed, these high concentration layers serve the function of a self-aligned channel stop, so that the spacing between elements can be easily reduced without deterioration of the element characteristics.

Furthermore, due to the fact that both of the wells have a retrograde concentration distribution, the sheet resistance of each well is low, which serves to suppress any rise in voltage resulting from a potential being developed across the sheet resistance due to a flow of trigger current. This prevents any rise in potential of the virtual base region of a stray transistor, and hence improves the resistance to latch-up.

In addition, the formation of high concentration layers in deep and shallow regions is executed by high-energy implantation using multi-layer films, with the implantation conditions being arbitrarily selectable irrespective of other types of ions, so that the manufacturing process can be very easily controlled. Hence, the CMOS structure can be changed to suit a particular integrated circuit pattern, and the resistance of the integrated circuit to CMOS latch-up can be increased.

Thus, a structure and manufacturing method for a complementary semiconductor device according to the present invention represents an essential technology for realizing high-level integrated semiconductor devices which have extremely high resistance to latch-up, as is required in the CMOS field, and which can be highly miniaturized. The invention will therefore have a very high industrial value.

What is claimed is:

1. A semiconductor device comprising:
   a semiconductor substrate of a first conductivity type;
   a well which is of a second conductivity type and which is selectively formed in the semiconductor substrate;
   a buried layer which is of the first conductivity type, the buried layer having a first portion of a higher dopant concentration than the semiconductor substrate, and being formed in a deep region of the semiconductor substrate directly below the well and a second portion formed in a region of the semiconductor substrate which is positioned higher than the region in which the first portion is formed; and
   an insulating isolation layer formed extending to an upper surface of a side region of the well;
   wherein the first and second portions of the buried layer are formed integrally in a region of the semiconductor substrate which is directly below the insulating isolation layer, surround the well within the semiconductor substrate, and have a high concentration of a dopant that is of the first conductivity type at a position which is directly below the insulating isolation layer, and wherein a transistor of the first conductivity type is formed at the well and a transistor of the second conductivity type is formed in the semiconductor substrate above the second portion of the buried layer.

2. A semiconductor device according to claim 1, wherein said well is formed with a shallow region which is positioned directly below said insulating isolation layer and a deep region which is positioned other than directly below said insulating isolation layer.

3. A semiconductor device according to claim 1, wherein the highest concentration of dopant in the second portion of the buried layer is positioned in a lower region of the second portion, wherein the highest concentration of dopant in the well is positioned in a lower region of the well, and wherein each of the transistors formed at the second portion of the buried layer and the well is formed in a region which is positioned higher than the respective highest concentration region.

4. A semiconductor device comprising:
   a semiconductor substrate of a first conductivity type;
   a well which is of a second conductivity type and which is selectively formed in the semiconductor substrate;
   a buried layer which is of the first conductivity type, the buried layer having a first portion of a higher dopant concentration than the semiconductor substrate, and being formed in a deep region of the semiconductor substrate directly below the well and a second portion formed in a region of the semiconductor substrate which is positioned higher than the region in which the first portion is formed; and
   an insulating isolation layer formed extending to an upper surface of a side region of the well;
   wherein the first and second portions of the buried layer are formed integrally in a region of the semiconductor substrate which is directly below the insulating isolation layer, surround the well within the semiconductor substrate, and have a high concentration of a dopant that is of the first conductivity type at a position which is directly below the insulating isolation layer, wherein the maximum dopant concentration of the first portion of the buried layer is greater than the maximum dopant concentration of the second portion of the buried layer, and wherein a transistor of the first conductivity type is formed at the well and a transistor of the second conductivity type is formed in the semiconductor substrate above the second portion of the buried layer.

5. A semiconductor device according to claim 4, wherein the highest concentration of dopant in the second portion of the buried layer is positioned in a lower region of the second portion, wherein the highest concentration of dopant in the well is positioned in a lower region of the well, and wherein each of the transistors formed at the second portion of the buried layer and the well is formed in a region which is positioned higher than the respective highest concentration region.

* * * * *